United States Patent [19]

Dolby

[11] Patent Number: 4,498,055
[45] Date of Patent: Feb. 5, 1985

[54] CIRCUIT ARRANGEMENTS FOR MODIFYING DYNAMIC RANGE

[76] Inventor: Ray M. Dolby, 50 Walnut St., San Francisco, Calif. 94118

[21] Appl. No.: 325,530

[22] Filed: Dec. 1, 1981

Related U.S. Application Data

[63] Continuation-in-part of Ser. No. 300,741, Sep. 10, 1981, which is a continuation-in-part of Ser. No. 292,958, Aug. 14, 1981, abandoned, and Ser. No. 275,382, Jun. 19, 1981, abandoned, and Ser. No. 275,205, Jun. 19, 1981, abandoned, and Ser. No. 275,204, Jun. 19, 1981, abandoned, and Ser. No. 180,771, Aug. 22, 1980, abandoned, and Ser. No. 163,950, Jun. 30, 1980, abandoned.

[51] Int. Cl.³ .......................... H03G 3/30; H03F 1/26
[52] U.S. Cl. .................................. 330/284; 330/126; 330/149; 333/14
[58] Field of Search ................. 330/86, 126, 149, 278, 330/284, 302; 328/145; 307/493; 333/14

[56] References Cited

U.S. PATENT DOCUMENTS

| | | | |
|---|---|---|---|
| 3,795,876 | 3/1974 | Takahashi et al. | 330/86 |
| 4,072,914 | 2/1978 | Haramoto et al. | 333/14 |
| 4,136,314 | 1/1979 | Blackmer et al. | 330/109 |

OTHER PUBLICATIONS

Fred Ives, "A Noise-Reduction System: Dynamic Spectral Filtering", Journal of the Audio Engineering Society, Sep. 1972, Vol. 20, No. 7.

Ray Dolby, "An Audio Noise Reduction System", Journal of the Audio Engineering Society, Oct. 1967, Vol. 15, No. 4.

Von Gerhard Dickopp et al., "Der Telefunken-Kompander", Rundfunktechn., Mitteilungen, Jan. 22, 1978, pp. 63–74.

Joseph Hull, "Dolby C-Type Noise Reduction", Audio Magazine, May 1981.

Primary Examiner—James B. Mullins
Assistant Examiner—G. Wan
Attorney, Agent, or Firm—Majestic, Gallagher, Parsons & Siebert

[57] ABSTRACT

Improvements in compressors, expanders and noise reduction systems are disclosed which reduce the susceptibility of such circuit arrangements to undue control by signals outside the pass-band(s) (i.e., stop-band signals) in which the circuits are active. Level dependent circuitry operates, particularly by means of nonlinear processing, to reduce the circuit response to the effect of stop-band signal components at high input signal levels.

42 Claims, 22 Drawing Figures

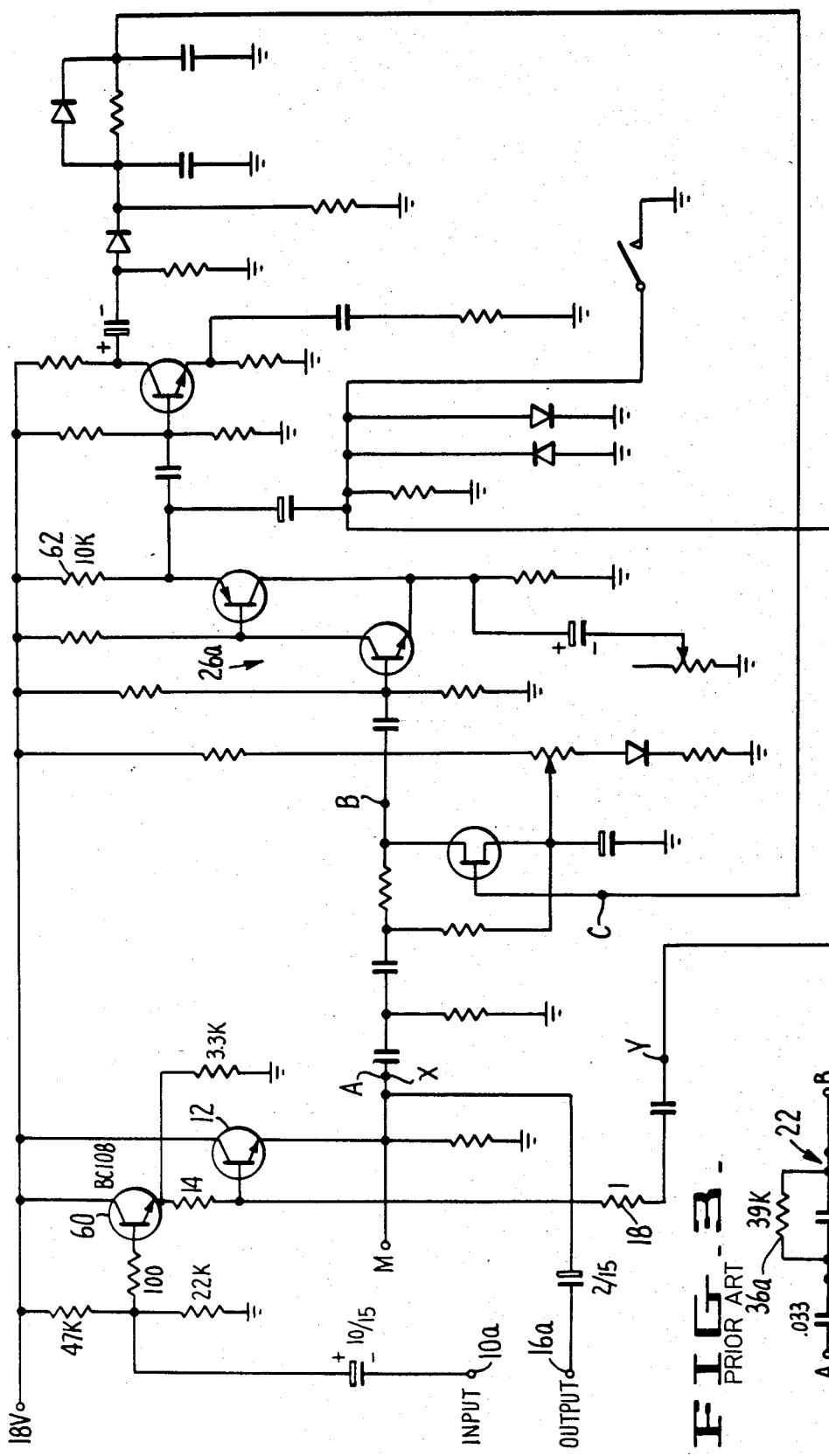

FIG_16
PRIOR ART

FIG._17.
PRIOR ART

CIRCUIT ARRANGEMENTS FOR MODIFYING DYNAMIC RANGE

This application is a continuation-in-part of my prior copending U.S. patent application Ser. No. 300,741, filed Sept. 10, 1981, which is in turn a continuation-in-part of my now abandoned U.S. patent applications Ser. No. 292,958, filed Aug. 14, 1981; Ser. No. 275,382, filed June 19, 1981; Ser. No. 275, 205, filed June 19, 1981; Ser. No. 275,204, filed June 19, 1981; Ser. No. 180,771, filed Aug. 22, 1980; and Ser. No. 163,950, filed June 30, 1980.

The present invention is concerned in general with circuit arrangements which alter the dynamic range of audio and other signals, namely compressors which compress the dynamic range and expanders which expand the dynamic range. More particularly, it relates to improvements in compressors and expanders that reduce their susceptibility to control by undesired signals. Such improvements are designated "modulation control" for reasons explained herein.

Compressors and complementary expanders are often used together (a compander system) to effect noise reduction; the signal is compressed before transmission or recording and expanded after reception or playback from the transmission channel. However compressors may be used alone to reduce the dynamic range, e.g., to suit the capacity of a transmission channel, without subsequent expansion when the compressed signal is adequate for the end purpose. In addition, compressors alone are used in certain products, especially audio products which are intended only to transmit or record compressed broadcasts or prerecorded signals. Expanders alone are used in certain products, especially audio products which are intended only to receive or play back already compressed broadcasts or prerecorded signals. In certain products, particularly audio recording and playback products, a single device is often configured for switchable mode operation as a compressor to record signals and as an expander to play back compressed broadcasts or prerecorded signals.

The amount of compression or expansion may be expressed in dB. For example, 10 dB of compression means that an input dynamic range of N dB is compressed to an output range of (N−10) dB. In a noise reduction system 10 dB of compression followed by 10 dB of complementary expansion is said to provide 10 dB of noise reduction.

The present invention relates in particular to improvements in circuit arrangements for modifying the dynamic range of an input signal, which circuit arrangements have a bi-linear characteristic (where "linear" in this context denotes constant gain) composed of:

(1) a low level linear portion up to a threshold,
(2) an intermediate level non-linear (changing gain) portion, above the threshold and up to a finishing point, providing a predetermined maximum compression ratio or expansion ratio, and
(3) a high level linear portion having a gain different from the gain of the low level portion.

The characteristic is denoted a bi-linear characteristic because there are two portions of substantially constant gain.

In practice, the threshold and finishing point are not always well defined "points". The two transition regions where the intermediate level portion merges into the low level and high level linear portions can each vary in shape from a smooth curve to a sharp curve, depending on the control characteristics of the compressor and expander.

It is also pointed out that circuit arrangements with bi-linear characteristics are distinguished from two other known classes of circuit arrangement, namely:

(a) a logarithmic or non-linear circuit arrangement with either a fixed or changing slope and with no linear portion: the gain changes over the whole dynamic range.

(b) circuit arrangements with a characteristic having two or more portions of which only one portion is linear ("uni-linear"). The invention is also applicable to uni-linear circuits, as is explained further below.

A circuit arrangement with a bi-linear characteristic has particular advantages and is widely used. The threshold can be set above the input noise level or transmission channel noise level in order to exclude the possibility of control of the circuit by noise. The high level portion of substantially constant gain avoids non-linear treatment of high level signals which would otherwise introduce distortion.

Two well known types of bi-linear circuits are referred to as sliding band circuits and fixed band (or split band or multiband) circuits.

Sliding band circuits create the specified desirable characteristic for the case of high frequency audio compression or expansion by applying high frequency boost (for compression) or cut (for expansion) by way of a high pass filter with a variable lower corner frequency. As the signal level in the high frequency band increases, the filter corner frequency slides upwardly so as to narrow the boosted or cut band and exclude the useful signal from the boost or cut. Examples of such circuits are to be found in U.S. Pat. No. Re. 28,426, U.S. Pat. Nos. 3,757,254, 4,072,914, 3,934,190 and Japanese Patent Application No. 55529/71. Such circuits can also be configured to act at low frequencies in which case low frequency boost or cut is provided by way of a low pass filter with a variable upper corner frequency.

In fixed band circuits the frequency spectrum is split into a plurality of bands by corresponding band-pass filters and the compression or expansion is effected in each band by a gain control device (whether an automatically responsive, diode type of limiting device or a controlled limiting device) in the case of a compressor, with some form of reciprocal or complementary circuitry for an expander. Examples of such circuits are to be found in U.S. Pat. Nos. 3,846,719, 3,903,485 and in *Journal of the Audio Engineering Society*, Vol. 15, No. 4, October, 1967, pp. 383–388. These fixed band circuits provide independent action in the various frequency bands.

It is known to construct bi-linear compressors and expanders, of both sliding band and fixed band type, by the use of only a single signal path. However, it is generally preferred to construct such devices by providing a main signal circuit which is linear with respect to dynamic range, with a combining circuit in the main circuit, and a further circuit which derives its input from the input or output of the further circuit and has its output coupled to the combining circuit. The further circuit includes a limiter (self-acting or controlled) and the limited further circuit signal boosts the main circuit signal in the combining circuit for the case of compression but bucks the main circuit signal for the case of expansion. The limited further path signal is smaller than the main path signal in the upper part of the input dynamic range. The main and further circuits are preferably and most conveniently separately identifiable signal paths. More than one further circuit is usually provided in the case of fixed band devices. A bi-linear device having main and further circuits is often referred to as a dual path device.

Such known dual path compressors and expanders are particularly advantageous because they enable the desired kind of transfer characteristic to be established in a precise way without problems of high-level distortion. The low level portion of substantially constant gain is established by giving the further path a threshold above the noise level; below this threshold the further path is linear. The intermediate level portion is created by the region over which the further path limiting action becomes partially effective and the high level portion of substantially constant gain arises after the limiter has become fully effective so that the further path signal ceases to increase and becomes negligible compared to the main path signal. At the highest part of the input dynamic range, the output of the circuit arrangement is effectively only the signal passed by the linear main path, i.e. linear with respect to dynamic range.

Examples of these known circuits are to be found in U.S. Pat. Nos. 3,846,719, 3,903,485 and U.S. Pat. No. Re. 28,426. There are also known analogous circuits which achieve like results but wherein the further path has characteristics inverse to limiter characteristics and the further path output bucks the main path signal for compression and boosts the main path signal for expansion (U.S. Pat. Nos. 3,828,280 and 3,875,537).

The invention is applicable to any of these known bi-linear circuits in order to obtain the advantages inherent therein. The invention is not limited to bi-linear circuits, but also may be employed to improve the operation of the aforementioned uni-linear circuits. As discussed further below, the invention may also be applied to logarithmic circuits provided that a departure from a logarithmic transfer function can be tolerated. However, the preferred embodiments relate to bi-linear circuits and except where specifically noted, reference is made to bi-linear circuits throughout this specification.

As mentioned previously, it is not essential to create the desired form of bi-linear characteristic by such "dual path" techniques. Alternatives exist, operating with single paths, as described in U.S. Pat. Nos. 3,757,254, 3,967,219, 4,072,914, 3,909,733 and Japanese Patent Application No. 55529/71, for example. Although these alternative circuits usually are not capable of producing such good results as dual path circuits, or may be less convenient and thereby less economical, they can produce generally equivalent results. Accordingly, the invention is also applicable to these known circuits.

The invention also pertains to known compressors and expanders in which series connected (e.g. multi-stage) bi-linear circuits are employed. Such arrangements are described in Belgian-PS No. 889,428.

In compressors and expanders, especially frequency selective or multi-band devices it is clearly desirable that strong signals in one frequency range should not unduly affect the behavior of signals in another frequency range. Filtering and equalization employed in the various circuits has been the standard method of dealing with this problem, both in logarithmic devices and in specialized devices such as the unilinear bi-linear circuits which have been described. In these prior art circuits the DC control signal which controls the variable gain/loss device [e.g., a variable gain device such as a voltage controlled amplifier (VCA) or a variolosser such as an FET attenuator] or variable filter is formed from the linear additive combination of the pass-band signals and the stop-band signals reaching the control circuit. The present invention effectively alters this simple combination, in a level dependent way, so as to optimize the compressor or expander performance with respect to pass-band versus stop-band signals. Non-linear operations are performed, including rectification of the signals in various portions of the spectrum and analyses are made of the relative and/or absolute amplitudes. The final control can be formed by selecting one of the signals, by combining two or more, or by performing non-linear operations such as limiting at least one of the signals.

In its broadest aspects, the invention contemplates a circuit arrangement for modifying the dynamic range of an input signal, comprising a frequency selective circuit determining a frequency pass-band within which the dynamic range modification takes place and dynamic modification means to effect progressive dynamic modification of signal components in that pass-band or to effect progressive sliding of the frequency pass-band, whereby the dynamic range is modified, the dynamic action of the dynamic modification means being responsive to increasing levels of substantially the linear additive combination of the pass-band signal components and the stop-band signal components within the circuit arrangement such that for high level input signals the dynamic action of the dynamic modification means becomes less responsive to stop-band signal components. In other words, at low input signal levels the circuit arrangement performs substantially as a conventional compressor or expander. However, at high input signal levels the compressor or expander action is modified by the modulation control circuitry of the invention.

A side effect is to modify the input-output level transfer characteristic of the device at any particular frequency or combination of frequencies. The overall effect is unimportant and may even be unnoticeable at the dominant frequency in bi-linear systems. However, in logarithmic systems the effect of modulation control, which is operative primarily in the high level portion of the dynamic range, is to cause a departure from a purely logarithmic characteristic. This may or may not be important in any particular application.

The invention derives from the observation that, ideally, in compressors and expanders the compression or expansion is responsive only to the levels of signals within desired frequency pass-bands and not to the levels of signals at other frequencies, which frequencies can be said to be in the stopbands. For example, in an ideal circuit, compression or expansion should not be affected by the levels of signals outside the pass band of the fixed band or the pass band of the sliding band (whether or not in its quiescent position). In the case of a sliding band circuit in accordance with the invention, the amount of frequency sliding of the variable band becomes no more than is necessary to assure that a dominant controlling signal is not boosted (in the case of compression) above a reference level.

As applied to bi-linear circuits, particularly those in the dual-path configuration, the invention takes further advantage of an inherent characteristic of such circuits: at high input signal levels the main path signal is substantially larger than the signal(s) in the further (or side) path(s). Consequently, high-level signal manipulations in the further path are essentially inaudible, and, except for phase shifts, are essentially not measurable (negligible level changes). This property of bi-linear circuits is most easily understood in the context of a dual-path circuit. However, the principle also applies in single-path bi-linear circuits in which there are two or more signal components in the same path instead of in separately identifiable paths.

The invention takes advantage of the above observations concerning bi-linear circuit characteristics. As compared with prior art bi-linear compressors and expanders, the invention provides for further manipulations of the signal (modulation control) in the high input signal level region where the overall compressor or expander response is linear. The comparatively low level noise reduction component of the signal is manipulated in this extra way only at high signal levels, thereby assuring that any effects important to the signal channel will be overshadowed by the large main signal component.

In dual-path bi-linear circuits, an effect of the invention is to modify the transfer characteristic of the side (or further) path such that the side path characteristic itself becomes bi-linear instead of flattening or downturning at high input signal levels. This is a consequence of the proportionality aspect of modulation control. That is, at high input levels the side path level does not drop below a selected proportion of the main path level (e.g. one-quarter or one-tenth). This is acceptable because the side path signal still remains substantially smaller than the main path signal at high input signal levels and because the stop-band is usually substantially shifted in phase with respect to the main path signal channel.

For these same reasons, the invention may be embodied in uni-linear circuits which have a linear response at high signal levels.

From another point of view, the action of the invention is to increase the levels of stop band signal components in the output of the device at high signal levels, but not to such an extent as to cause problems with the recording or transmission channel since, relatively speaking they are still small. Increasing the levels of such stop band signal components is not in itself a particularly advantageous thing but is necessary in order to obtain improved dynamic action and noise reduction within the pass band. Increasing the levels of stop band signals in the output of the device at high signal levels is achieved by reducing the levels of stop band signal components in the control signal channel at high signal levels, or by so arranging things that the control signal is generated as if there was a reduced level of stop band signal components in the signal used to produce the control signal at high signal levels (e.g., by filtering and limiting in the control circuits or by frequency dependent control signal bucking arrangements).

A further advantage of the invention is that in listening tests, "pumping effects" of single-ended compressors and expanders are substantially reduced if not eliminated. Thus, in addition to its use in complementary noise reduction systems, the invention is particularly useful for use in stand alone compressors and expanders (i.e., compressors for use in compressing signals that are not subsequently expanded and expanders for use in expanding signals that were not previously compressed).

By way of background of the invention, although various practical embodiments of noise reduction circuits have proven successful, in operation such circuits depart in some degree from the ideal because of the problem of stop-band signals unduly controlling compression and expansion. The effect of such shortcomings is manifested in several interrelated ways:

(1) a reduction in noise reduction effect in a portion of the noise reduction system pass band;

(2) noise modulation effects (e.g., the level of a signal at one frequency, modulating the noise level in a different part of the frequency spectrum);

(3) signal modulation effects (e.g., the level of a signal at one frequency modulating the level of a signal at another frequency);

(4) cross modulation effects (e.g. spurious modulation products resulting from one of more of the last two enumerated modulation effects).

The degree to which these shortcomings are observable depends on the type of circuits employed in the noise reduction system, the recording and playback equipment, the record/playback channel or medium and the nature of the signal material. In many cases, the shortcomings are essentially unobservable except by test instruments. Nevertheless, it is desirable to deal with these shortcomings. Because the aforementioned shortcomings of known compressors, expanders and noise reduction systems relate to modulation effects, either of signals or of noise, the invention described herein for reducing such shortcomings is referred to as modulation control.

The severity of these modulation effects depends to a great extent on the uniformity of the transmission channel between the compressor and expander. For example, in magnetic tape recording and playback systems, a frequency response phenomenon known as "head bumps" exists. Even in professional systems, particularly those operating at 30 ips, the playback response below 100 Hz is nonuniform due to the relationship between the signal wavelength on tape and the playback head dimension, which are of the same order. If the compressor/expander system is susceptible to signals in the head bump region, such signals when played back may control the expander in a non-complementary way such that signals or noise at higher frequencies, e.g., up to 3 kHz, may be modulated by the signals in the region of or below 100 Hz.

In prior art fixed band (single band and multi-band) circuits, various filtering techniques have been used to minimize the control of compression and expansion by undesired signals. According to these techniques, sharp filters (e.g., with steep skirts) are placed in the signal path or in the control circuit (of the limiting device).

However, the use of signal path filters sharper than 6 dB/octave (e.g., single pole filters) in multiband compressors and expanders causes amplitude and phase effects such that when the overall signal spectrum is recombined there are amplitude and phase errors. This problem is greatly exacerbated if filters sharper than 12 dB/octave are employed. However, a filter slope of only 6 or 12 dB/octave may not adequately discriminate against all unwanted signals. In the multi-band (fixed band) bi-linear circuit examples of U.S. Pat. No. 3,846,719 and in *Journal of the Audio Engineering Society*, Vol. 15, No. 4, October, 1967, pp. 383–388, filters having a 12 dB/octave slope are used in the signal path of three of the four fixed bands. A flat overall frequency response is obtained only by the use of a complex filter characteristic in the frequency band adjacent the sharp filters. Such a solution obviously is not universally applicable.

In the logarithmic multi-band (fixed band) compressor/expander circuit described in *Rundfunktechn. Mitteitungen,* Jahr. 22 (1978) H. 2, pp. 63–74, the input signal is divided into four bands by single pole filters. However, the control circuits for each band employ sharp 18 dB/octave filters. A sharp control circuit filter (12 dB/octave) is also employed in a single fixed band compressor/expander circuit sold under the trademark "dbx II." However, the use of sharp control circuit filters results in excessive amplification of high level signals outside the control circuit filter pass band when high amplitude signals are *not* present within the control circuit filter pass band, resulting in the possible overdriving of the transmission channel unless sharp cutoff filters are used in the signal channel as well.

A prior art technique referred to as spectral skewing is described in Belgian-PS No. 889,427; *Audio,* May 1981, pp. 20–26; and paper J-6 and preprint presented at November 1981 Convention, Audio Engineering Society, New York, N.Y. Spectral skewing is also concerned with the suppression of modulation effects resulting from compressor/expander non-complementarity due to transmission channel errors. According to the teachings of spectral skewing, sharp filtering is provided at least in the compressor at a frequency well within the normal bandpass of the system and within the flat response region of the transmission channel. While spectral skewing is successful in reducing spurious signal modulation effects caused by channel irregularities, it does not address the problem of excessive frequency sliding in sliding band systems or of excessive attenuation in fixed band systems.

Thus, the present invention seeks to minimize the control of expansion and compression by undesired signals without the attendant side effects and/or complexity of the prior art.

Although measurable modulation effects are not totally suppressed by the invention, the effects of the invention in audio applications are supplemented by psychoacoustical masking effects such that perceived effects are, for most listeners and musical material, inaudible. That is, only the modulation of a signal (or signals) sufficiently spaced in frequency from the modulating signal is perceived by the human ear. Such modulation is minimized by the present invention. While the modulation of a signal (or signals) by another signal closely spaced in frequency is less likely to be affected or improved by the invention, such phenomena will likely not be perceived by the ear because of two related effects:

(a) a weak signal close in frequency to a strong signal is masked by the strong signal such that the weak signal is inaudible, or (b) if the closely spaced signal is audible before compression or is increased in level by the compressor such that it becomes audible, then there is a psychoacoustic tolerance of modulation effects because of the close frequency spacing.

Consequently, the human ear is not able to discern modulation effects of signals at closely spaced frequencies and thus the invention need not be fully effective for such signals.

The operating environment of the invention is a fixed band or sliding band compressor or expander circuit in which there is a variable circuit means, usually controlled by a DC control signal, which is operative primarily in the lower part of the overall dynamic range. In accordance with the invention, modulation control means are employed in the upper part of the dynamic range to prevent the action of the variable circuit means from becoming any greater than is necessary to provide the nominal required attenuation of dominant signals, whether such signals have frequencies in the pass-band or in the stop-band. In practice, controlling the action of the variable circuit means usually comprises operating upon the control signal controlling the circuit means.

The modulation control may take the form of active or passive control signal limiting means which become operative at high signal levels or of means employing circuits which detect the presence of high level signals and generate signals which oppose the increase of the control signal level. Such control signal limiting may take place in one or more frequency selective control signal channels; if more than one, means are provided for selecting or combining the control signals so as to provide the variable circuit element with an optimal control signal. When a high level signal detection circuit, or modulation control generator, is used, it may operate in various ways which will give a measure of signal levels in at least the upper part of the dynamic range. For example, the modulation control signal may be derived from the input or output signal of the compressor or expander. The modulation control signal in effect provides a reference for the DC control signal applied to the variable circuit elements (VCA or voltage controlled filter). The reference signal is combined in phase opposition with (e.g., opposite polarity or so as to buck) the DC control signal generated primarily in response to stop-band signal components to provide a limit as to how large the control signal to the variable circuit element can become in response to signals in the stop-band, i.e. outside the pass band of the fixed band or sliding band. In practice this limit can be made relatively "hard" or relatively "soft". That is, continued increases in the control signal can be rather abruptly stopped or allowed to continue at a reduced rate.

The modulation control signal may also be derived from the variable circuit (VCA or variable filter) by measuring voltage or current components of the variable circuit and, if necessary, equalization in order to generate a signal usable in providing a limit as to how large the control signal to the variable circuit can become in response to signals in the stop-band.

In terms of results, the invention as applied to either fixed band or sliding band devices provides a substantial immunity to signals outside the pass band of the fixed band or the sliding band. In the case of sliding band devices, the invention provides a further related advantage, i.e., the sliding band slides only so far in response to a dominant signal as is necessary to bring the gain at the signal frequency to substantially unity, at least for levels at or above a reference level. The reference level is at or near the upper area of the dynamic operating range of the device, such as within about 6–20 dB of the maximum allowable level. Prior art sliding band circuits are susceptible to excessive sliding such that the variable filter corner frequency is pushed farther than is needed with high level signals, causing not only potential modulation effects but also resulting in a loss of noise reduction effect in part of the spectrum.

As applied to sliding band dual-path circuits, the invention provides for, in the simplest embodiment, the rectification and smoothing of the input or output signal and the combining of the resultant DC reference signal with the control signal applied to the variable filter. The level of the reference signal can be set for a desired proportion limit on a dominant further path signal relative to the corresponding component in the main path signal. For example, the modulation control circuit may be made to operate such that in, say, the upper 20 dB of the dynamic range the limiter provides only that attenuation required to keep the dominant signal component in the further path held at a relatively constant proportion of that component in the main path signal (e.g. 15 dB below).

As applied to fixed band dual-path circuits, the invention provides for, in the simplest embodiment, as in the sliding band embodiment, the rectification and smoothing of the input or output signal to generate a modulation control signal that responds primarily to the high level signal components of the input signal. However, in the case of fixed band circuits a sharp filter is used in the pass-band control circuit to provide a pass-band control signal. In addition a stop-band control circuit is employed to provide a stop-band control signal. The modulation control signal provides a reference for the stop-band control signal (i.e. opposes it at high signal levels). The referenced stop-band control signal is compared with the pass-band control signal and the two are combined generally to favor the larger, via a maximum signal selection circuit, which then controls the VCA. The overall effect of the circuit is to provide the required attenuation (overall compression law) in the pass-band, while avoiding control of the pass-band attenuation by large signal components in the stop-band, and while avoiding the possibility of excessive amplification of high level signals in the stop-band, as seen at the output of the overall compressor.

In these and other embodiments in which a reference bucking signal is generated, the signal may be derived from the input or output because at high signal levels, where the invention operates, the input and output levels are nearly the same. In some embodiments the modulation control signal may be subjected to filtering or equalization before rectification. Such equalization works in conjunction with the fixed or variable filtering or equalization employed in the signal circuits and control circuits, to yield an overall modulation control which is most effective in suppressing control by signal components in the stop-band, while at the same time interfering as little as possible with control by signal components in the pass-band.

Other embodiments of the invention are described hereinafter. For example, the amplified AC output of the sliding band variable filter may be divided into two or more band pass channels, each channel subjected to selected limiting thresholds, rectified and combined to produce a control signal. By selecting appropriate thresholds, the DC control circuit of the sliding band compressor or expander then has a frequency dependent maximum output characteristic that functions to minimize the control of the compressor or expander by signals outside the sliding pass band.

In a variation using only one control circuit channel, a low frequency boost circuit is placed in the control amplifier. This is followed by an amplitude limiter and then a high frequency boost circuit. The resulting AC signal is then rectified and smoothed to form the control signal.

The invention will be described in more detail, by way of example, with reference to the accompanying drawings, in which:

FIG. 3 is a schematic circuit diagram of a prior art sliding band expander.

FIG. 4 is a schematic circuit diagram of a modification to FIGS. 2 and 3.

Figure 12:
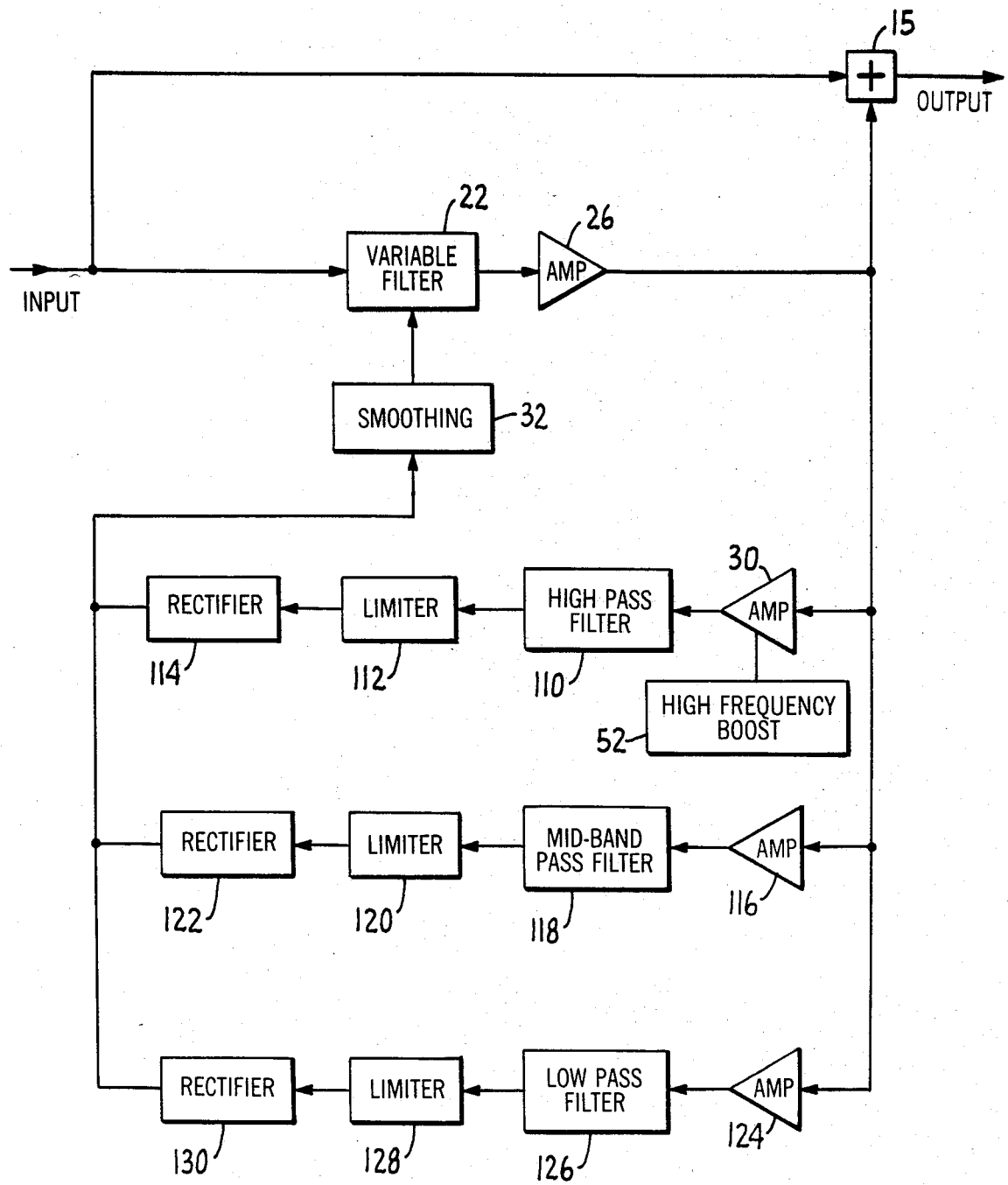

FIGS. 12 $\propto$ 15 are block diagrams of further embodiments of the invention embodied in sliding band compressors.

Figure 16:
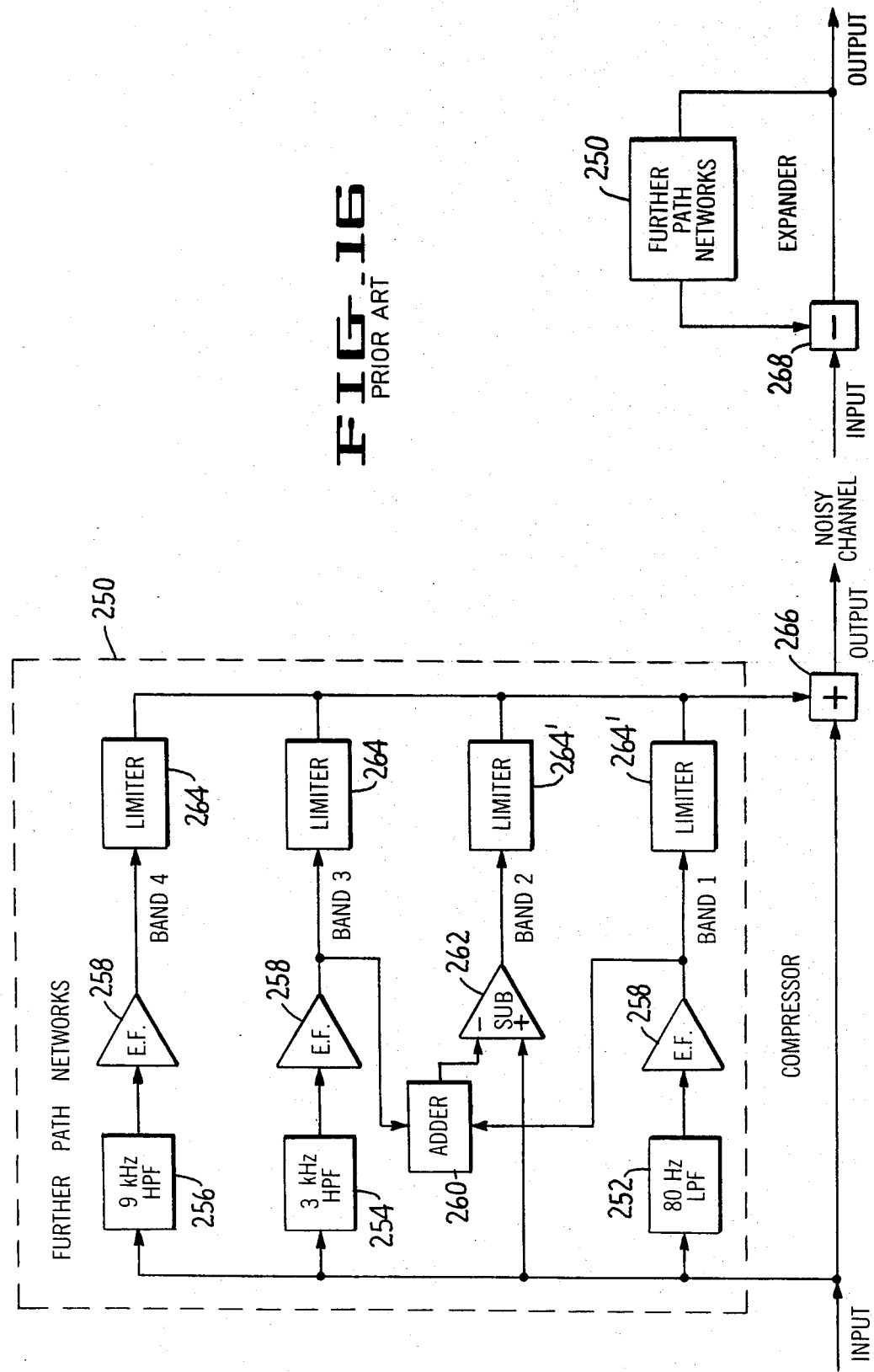
Figure 17:
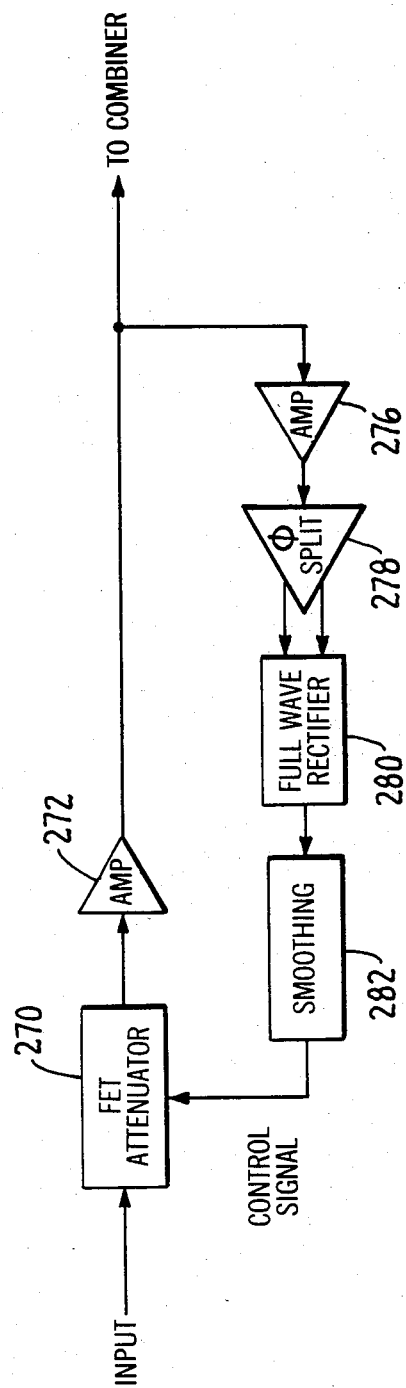

FIGS. 16 and 17 are block diagrams of a prior art fixed band compressor and expander.

Figure 18:
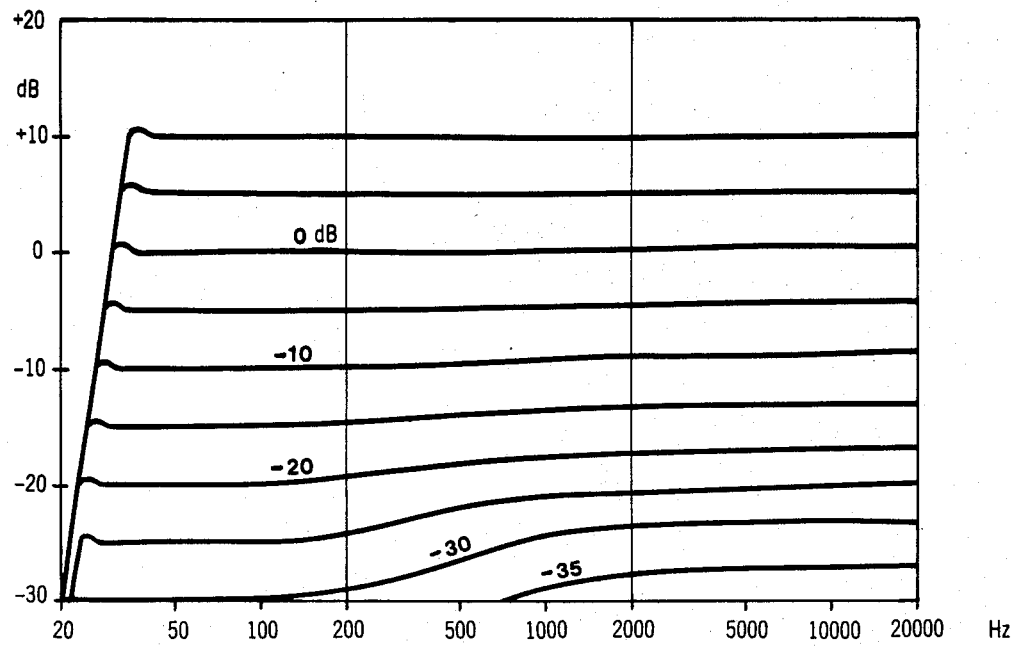

FIGS. 18 $\propto$ 20 are response curves illustrating the effects of modulation control according to the invention embodied in a sliding band compressor.

Figure 21:
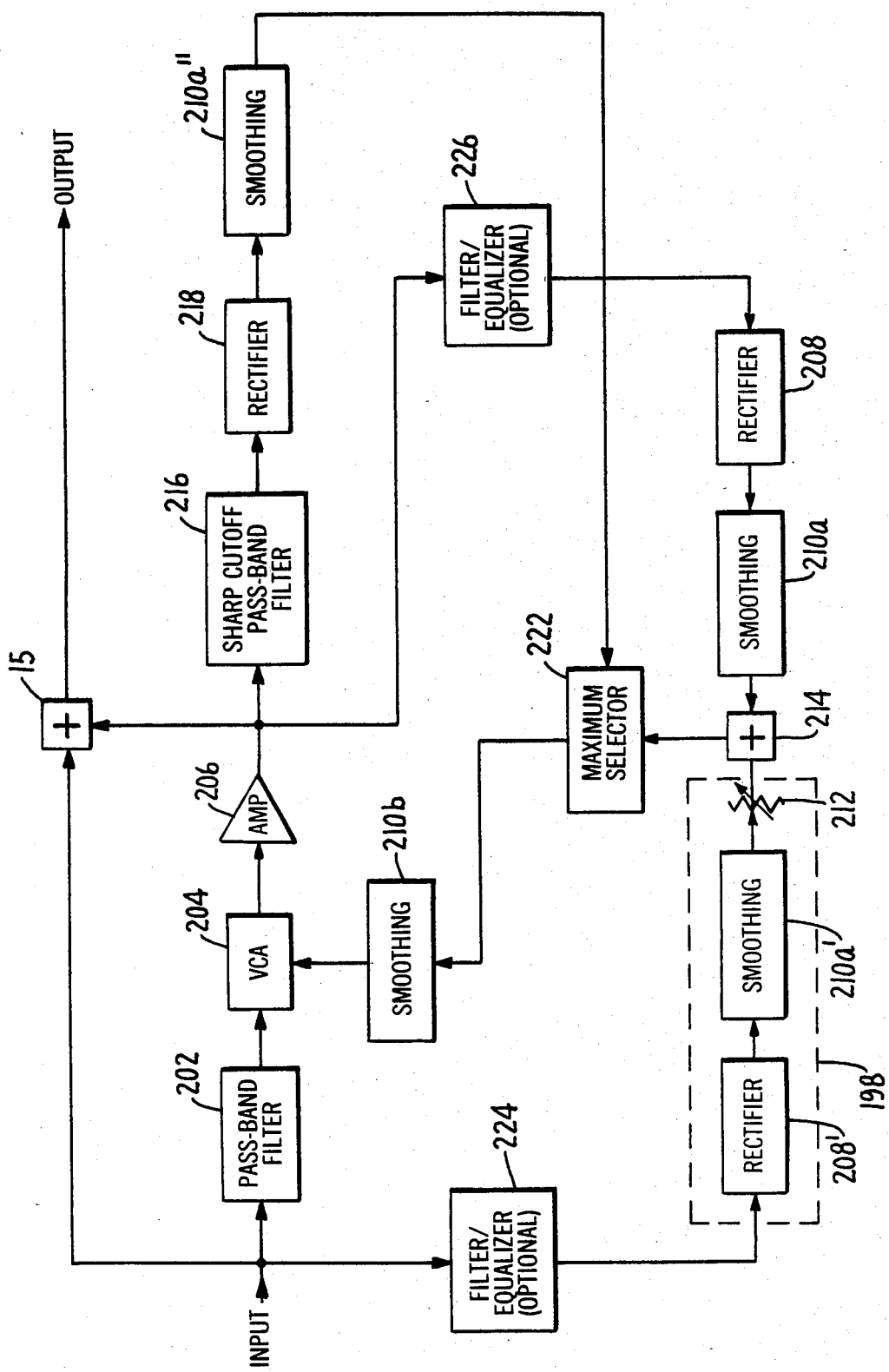

FIG. 21 is a block diagram of a preferred embodiment of the invention embodied in a fixed band compressor.

Figure 22:
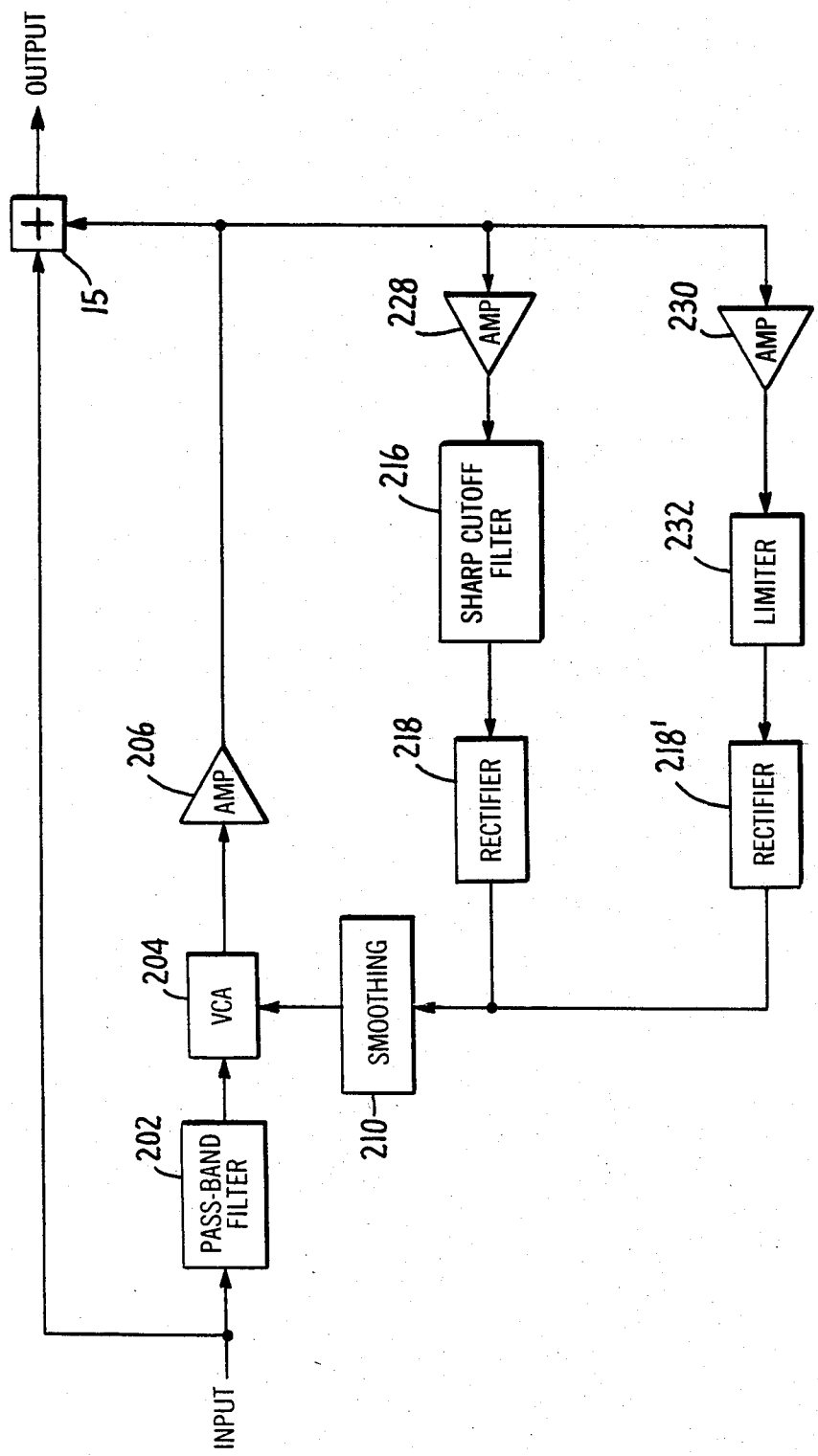

FIG. 22 is a block diagram of an alternative embodiment of the invention embodied in a fixed band compressor.

Figure 1:
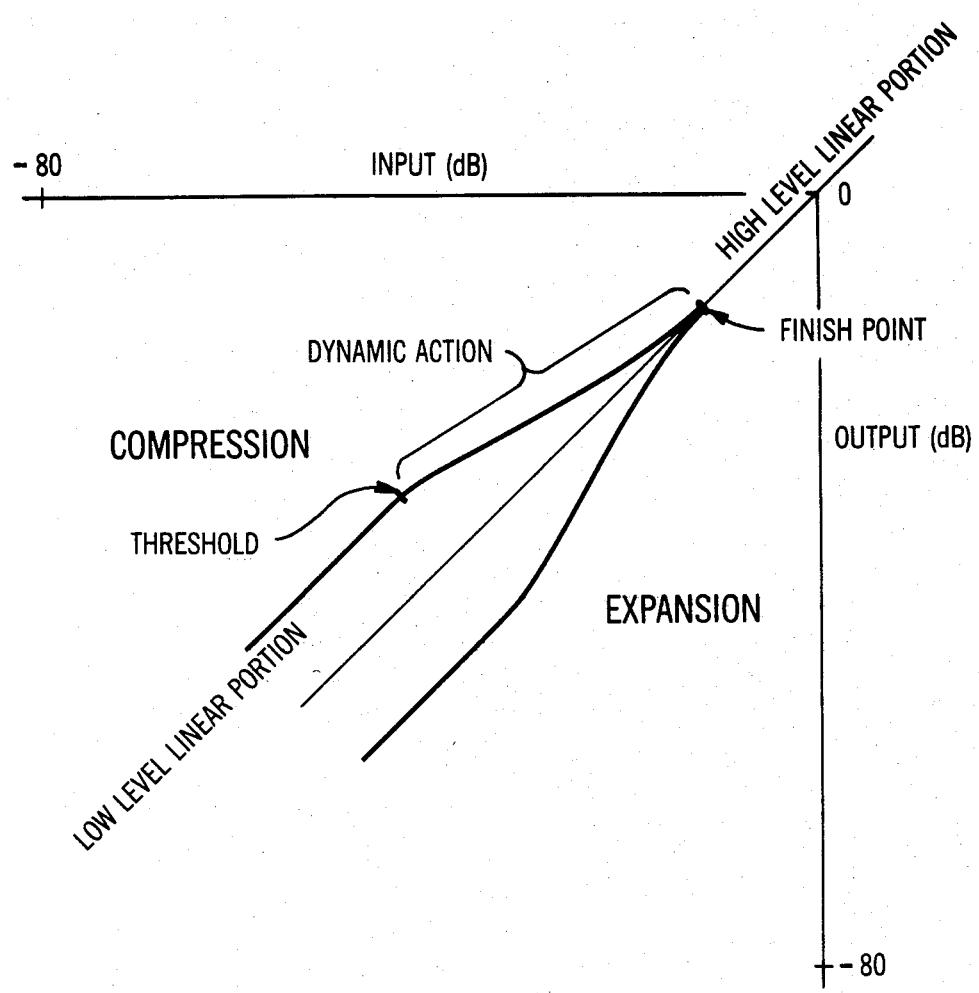
FIG. 1 is an exemplary set of curves showing complementary bi-linear compression and expansion characteristics.

Exemplary bi-linear complementary compression and expansion transfer characteristics (at a particular frequency) are shown in FIG. 1, indicating (for the compression characteristic) the low level portion of substantially constant gain, the threshold, the portion where dynamic action occurs, the finishing point, and the high level portion of substantially constant gain.

Figure 2:
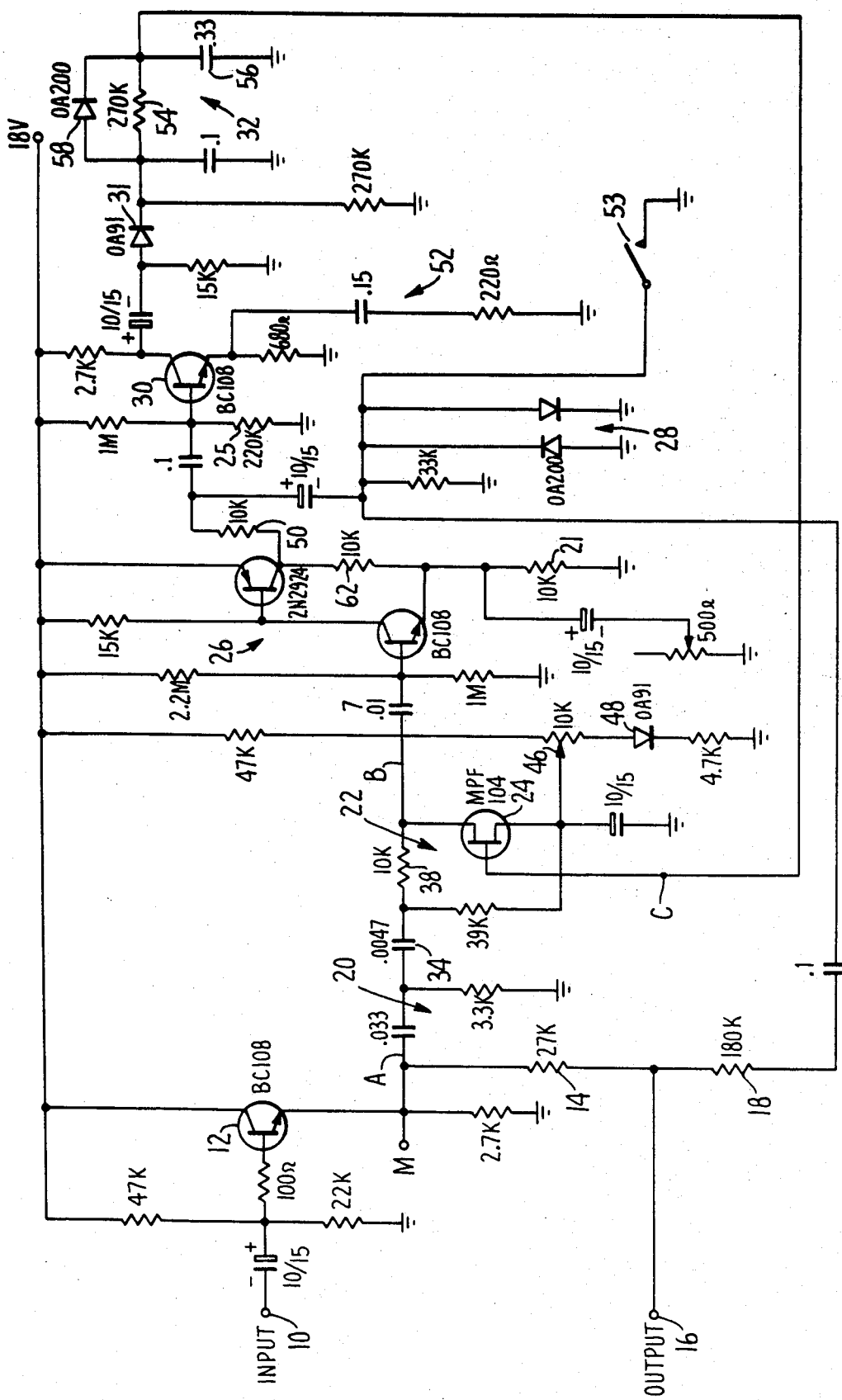
FIG. 2 is a schematic circuit diagram of a prior art sliding band compressor.
Figure 5:
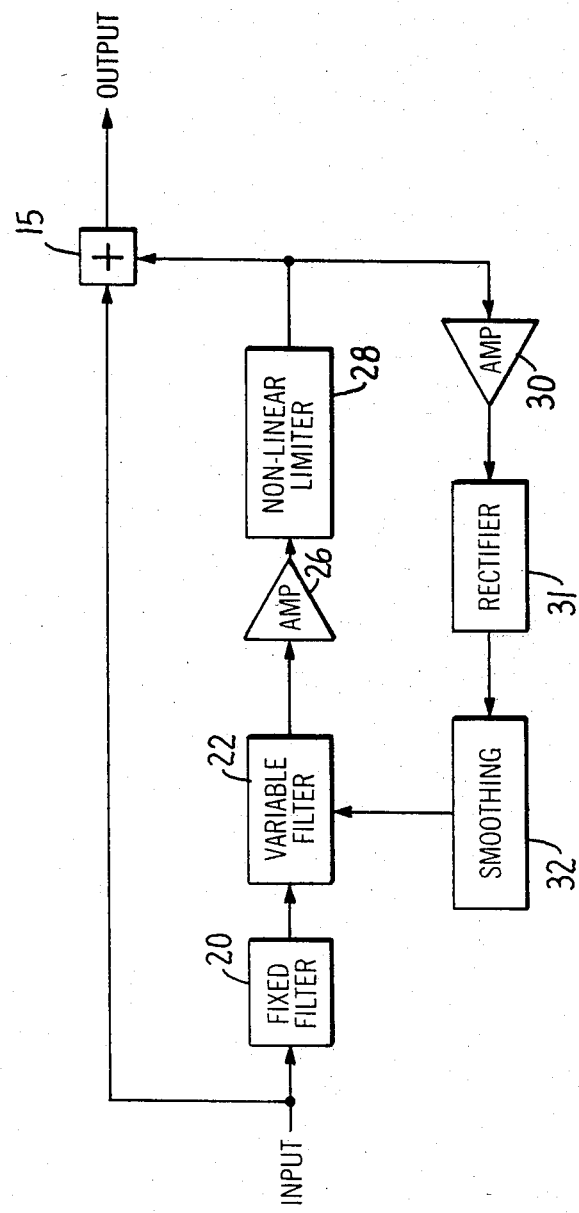
FIG. 5 is a block diagram of a prior art sliding band compressor.

Details of one dual path sliding band bi-linear circuit are set forth in FIGS. 2, 3 and 4. The sliding band embodiments of the present invention are described with reference to this circuit, although the invention is not limited to use in such circuits. FIGS. 2, 3 and 4 are the same as FIGS. 4, 5 and 10 respectively of U.S. Pat. No. Re. 28,426 and further details of said circuits, their operation and theory are set forth therein. FIG. 5 is a block diagram of FIG. 2 (with or without the FIG. 4 modification). The following description of FIGS. 2, 3 and 4 is taken in large part from U.S. Pat. No. Re. 28,426.

The circuit of FIG. 2 is specifically designed for incorporation in the recording channel of a consumer tape recorder, two such circuits being required for a stereo recorder. The input signal is applied at terminal 10 to an emitter follower stage 12 which provides a low impedance signal. This signal is applied firstly through a main, straight-through path constituted by a resistor 14 to an output terminal 16 and secondly through a further path the last element of which is a resistor 18 also connected to the terminal 16. The resistors 14 and 18 add the outputs of the main and further paths to provide the required compression law.

The further path consists of a fixed filter 20, a variable cut-off filter 22 including a FET 24 (these constituting the filter/limiter), and an amplifier 26 the output of which is coupled to a double diode limiter or clipper 28 and to the resistor 18. The non-linear limiter suppresses overshoots of the output signal with abruptly increasing input signals. The amplifier 26 increases the signal in the further path to a level such that the knee in the characteristic of the limiter or overshoot suppressor 28, comprising silicon diodes, is effective at the appropriate signal level under transient conditions. The effective threshold of the overshoot suppressor is somewhat above that of the syllabic filter/limiter. The resistors 14 and 18 are so proportioned that the required compensating degree of attenuation is then provided for the signal in the further path.

The output of the amplifier 26 is also coupled to an amplifier 30 the output of which is rectified by a germanium diode 31 and integrated by a smoothing filter 32 to provide the control voltage for the FET 24.

Two simple RC filters are used, though equivalent LC or LCR filters could be used. The fixed filter 20 provides a cut-off frequency of 1700 Hz (now 1500 Hz), below which diminishing compression takes place. The filter 22 comprises a series capacitor 34 and shunt resistor 36 followed by a series resistor 38 and the FET 24, with its source-drain path connected as a shunt resistor. Under quiescent conditions with zero signal on the gate of the FET 24, the FET is pinched off and presents substantially infinite impedance; the presence of the resistor 38 can then be ignored. The cut-off frequency of the filter 22 is thus 800 Hz (now 750 Hz), which it will be noted is substantially below the cut-off frequency of the fixed filter 20.

When the signal on the gate increases sufficiently for the resistance of the FET to fall to less than say 1K, the resistor 38 effectively shunts the resistor 36 and the cut-off frequency rises, markedly narrowing the pass band of the filter. The rise in cut-off frequency is of course a progressive action.

The use of a FET is convenient because, within a suitable restricted range of signal amplitudes, such a device acts substantially as a linear resistor (for either polarity signal), the value of which is determined by the control voltage on the gate.

The resistor 36 and FET are returned to an adjustable tap 46 in a potential divider which includes a temperature compensating germanium diode 48. The tap 46 enables the compression threshold of the filter 22 to be adjusted.

The amplifier 26 comprises complementary transistors giving high input impedance and low output impedance. Since the amplifier drives the diode limiter 28, a finite output impedance is required and is provided by a coupling resistor 50. The diodes 28 are, as already noted, silicon diodes and have a sharp knee around ½ volt.

The signal on the limiter and hence on the resistor 18 can be shorted to ground by a switch 53 when it is required to switch the compressor out of action.

The amplifier 30 is an NPN transistor with an emitter time constant network 52 giving increased gain at high frequencies. Strong high frequencies (e.g. a cymbal crash) will therefore lead to rapid narrowing of the band in which compression takes place, so as to avoid signal distortion.

The amplifier is coupled to the smoothing filter 32 through the rectifying diode 31. The filter comprises a series resistor 54 and shunt capacitor 56. The resistor 54 is shunted by a silicon diode 58 which allows rapid charging of the capacitor 56 for fast attack, coupled with good smoothing under steady-state conditions. The voltage on capacitor 56 is applied directly to the gate of the FET 24.

A complete circuit diagram of the complementary expander is provided in FIG. 3, but a full description is not required as substantially as the circuit is identical to FIG. 2, component values, are therefore not for the most part shown in FIG. 3.

The differences between FIGS. 2 and 3 are as follows:

In FIG. 3, the further path derives its input from the output terminal 16a, the amplifier 26a is inverting, and the signals combined by the resistors 14 and 18 are applied to the input (base) of the emitter follower 12, the output (emitter) of which is coupled to the terminal 16a. To ensure low driving impedance, the input terminal 10a is coupled to the resistor 14 through an emitter follower 60. Suitable measures must be taken to prevent bias getting in the expander.

The amplifier 26a is rendered inverting by taking the output from the emitter, instead of the collector, of the second (PNP) transistor. This alteration involves shifting the 10K resistor 62 (FIG. 2) from the collector to the emitter (FIG. 2), which automatically gives a suitable output impedance for driving the limiter. The resistor 50 is therefore omitted in FIG. 3.

It should be noted that it is important in aligning a complete noise reduction system to have equal signal levels on the emitters of the transistors 12 in both compressor and expander. Metering terminals M are shown connected to these emitters.

FIG. 4 shows a preferred circuit, for replacing the circuit between points A, B and C in FIGS. 2 and 3. When the FET 24 is pinched off, the second RC network 22 is inoperative, and the first RC network 20 then determines the response of the further path. The improved circuit combines the phase advantages of having only a single RC section under quiescent conditions with the 12 dB per octave attenuation characteristics of a two-section RC filter under signal conditions.

In the practical circuit, using MPF 104 FET's, the 39K resistor 36a is necessary in order to provide a finite source impedance to work into the FET. In this way the compression ratio at all frequencies and levels is held to a maximum of about 2. The 39K resistor 36a serves the same compression ratio limiting function in the improved circuit as the resistor 36 in the circuit of FIG. 2 or FIG. 3. In addition, this resistor provides a low frequency path for the signal.

Certain details of the circuit of FIGS. 2, 3 and 4 have evolved over the years and more modern forms of the circuit have been published and are well known in the art. Reference to the specific circuit in U.S. Pat. No. Re. 28,426 is made for convenience in presentation.

FIG. 5 is a block diagram showing the major elements of the compressor of FIGS. 2 and 4. Combining circuit 15 represents the combining resistors 14 and 18 of FIGS. 2 and 3.

Figure 6:
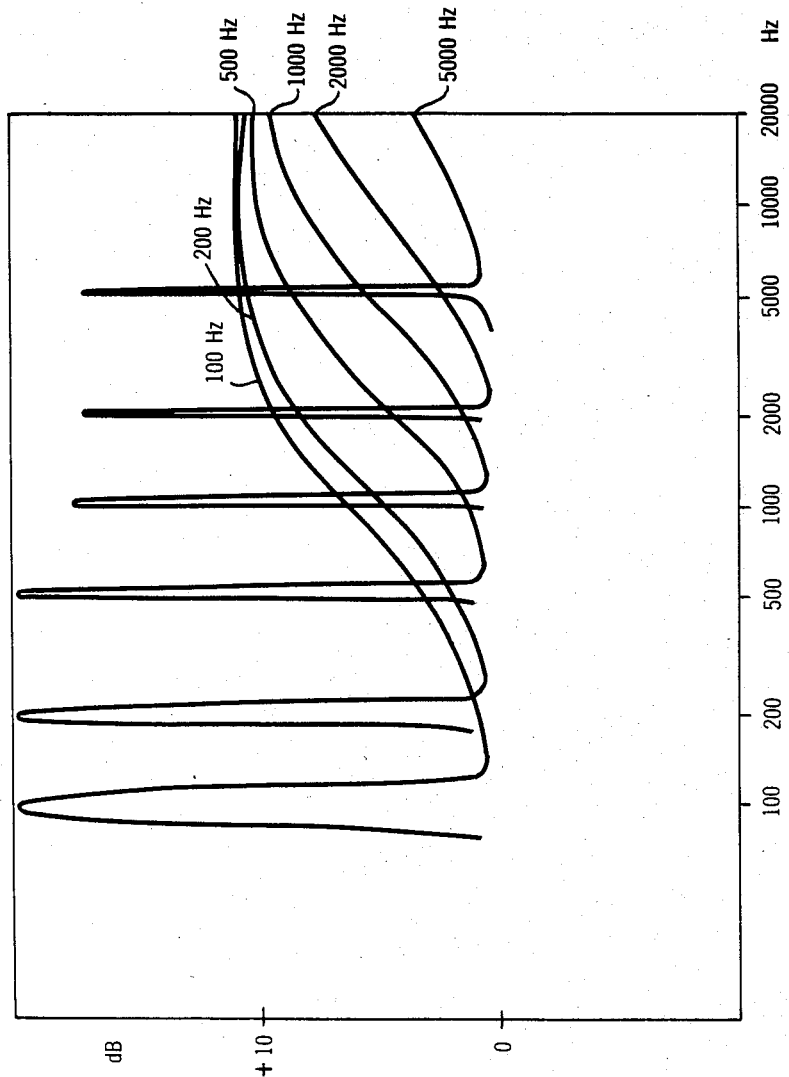
FIG. 6 is a set of probe tone curves illustrating the sliding band action of the circuit of FIGS. 2 and 4.

The variable band action of the sliding band device can be seen in FIG. 6, showing an actual chart recorder probe tone response obtained from the circuit of FIG. 2 incorporating FIG. 4. The variable band action is shown by plotting the compressor frequency response by means of a low-level probe tone (the level of which is below the compressor threshold) in the presence of a high-level signal; the probe is detected at the compressor output by means of a tracking filter. The high-level signal causes the compressor circuitry to operate. the graph showing the effect on the turnover frequency of the filter.

In a sliding band device in accordance with the invention, the amplitude of the high level or dominant signal that causes the sliding band action should not cause excessive sliding, nor should the presence of other high level signals outside of the sliding band pass band cause excessive sliding. Excessive sliding means movement of the variable filter turnover frequency farther than necessary to produce a sliding band compressor characteristic which avoids boosting the dominant signals above a reference level. The absolute value of the reference level is chosen by the system designer, but is usually some 10 dB below the highest levels normally used.

Figure 7:
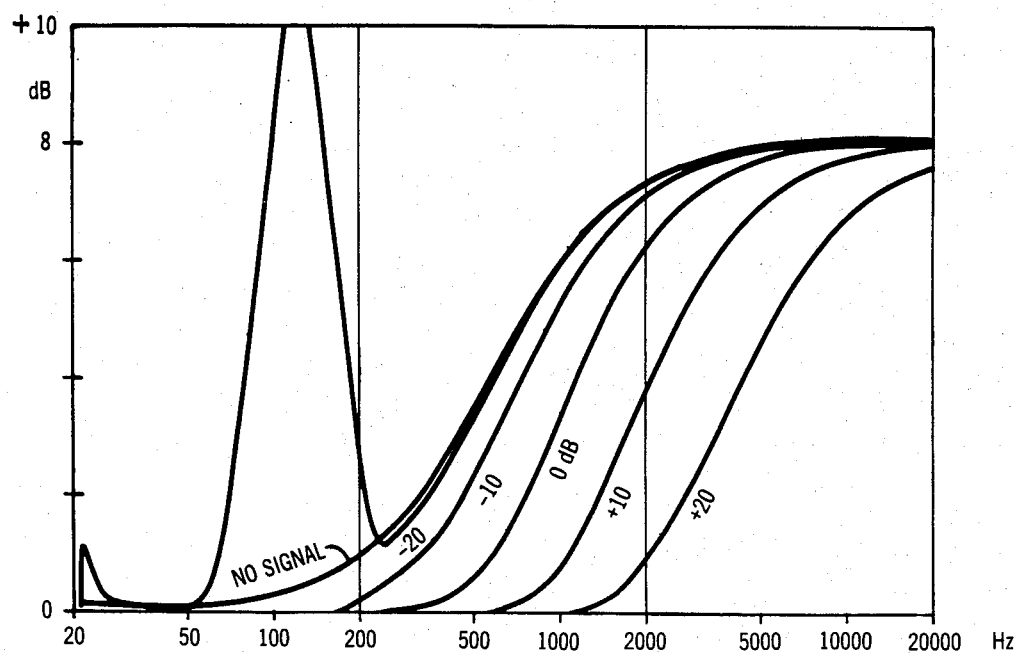
FIGS. 7–10 are a series of probe tone curves illustrating the effects of modulation control according to the invention embodied in a sliding band compressor.
Figure 9:
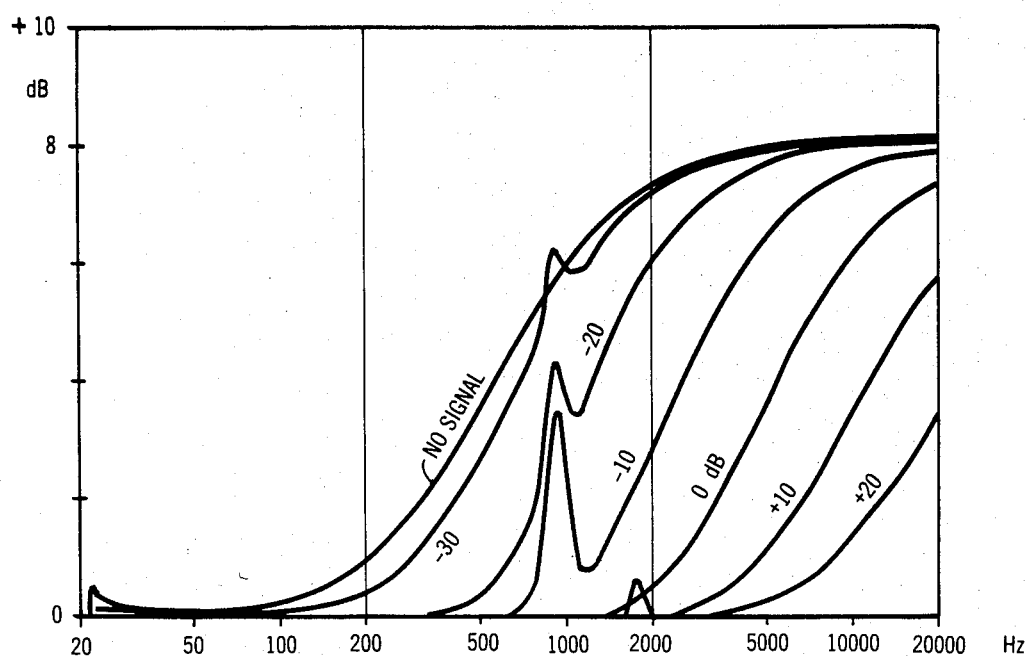
Figure 10:
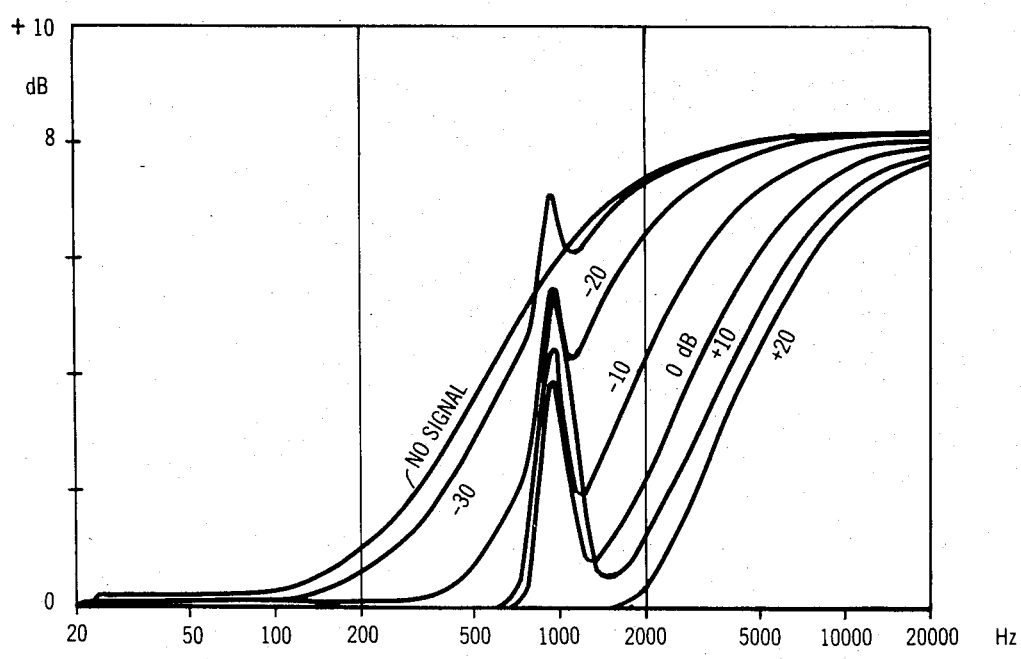

FIG. 7 shows a further set of actual chart recorder probe tone curves for the case of a sliding band compressor circuit similar in design to that of FIG. 2 (with the FIG. 4 modification), but with a low level gain of 8 dB and a filter quiescent frequency of 800 Hz. The probe tone level is at −40 dB, below the compressor threshold. Curves are taken for a 100 Hz signal at −20, −10, 0, +10 and +20 dB, where 0 dB is the reference level. Also, a curve for no 100 Hz signal is shown. The −10, 0, +10 and +20 dB chart recording curves are all started at about 200 Hz. This is also the case for FIG. 8. In FIGS. 9 and 10 there are also curves for the no signal condition.

Referring again to FIG. 7, ideally, there should be so sliding in response to a 100 Hz signal because it is well outside the pass band of the circuit at its lowest (quiescent) frequency. Nevertheless, as the 100 Hz signal increases in level, the band slides upward. The −10, 0, +10 and +20 dB curves need not slide any farther than the −20 dB curve in order to avoid any substantial boosting of the 100 Hz signal. The unnecessary sliding has two effects: (a) substantial noise reduction action is lost (during playback) because no boosting takes place at frequencies where it otherwise can take place and (b) as the amplitude of the 100 Hz signal varies it can modulate signals at higher frequencies as the sliding band varies under its control, resulting in possible incorrect restoration of the signal by the expander if the recording or transmission channel has an irregular frequency response in the vicinity of 100 Hz.

Figure 8:
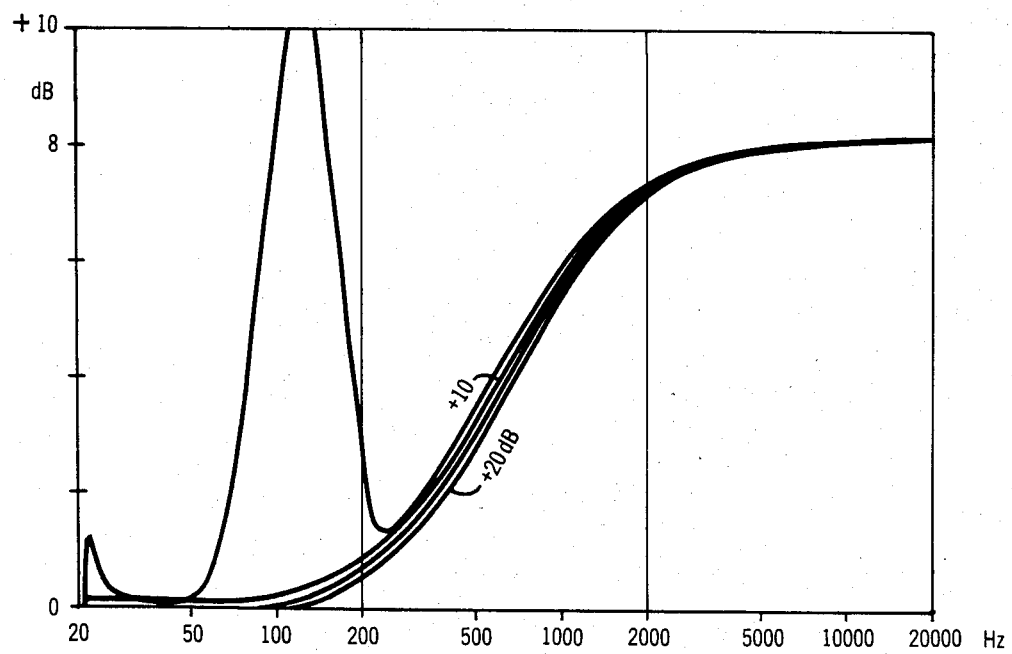

FIG. 8 shows a set of actual chart recorder probe tone curves for the same circuit, but with the addition of modulation control circuitry as described hereinafter. Essentially no sliding occurs for the same levels of the 100 Hz signal as in the FIG. 7 arrangement. The sliding band compressor is made essentially immune to strong signals outside its pass band. The sliding band response is essentially the same as its response below threshold in the presence of no dominant signals.

The effect of modulation control for sliding band compressors is further illustrated by FIGS. 9 and 10, which are also actual chart recorder probe tone curves taken with the same circuit and probe tone level as with FIGS. 7 and 8. In this case, the effect of a dominant signal at 800 Hz, a frequency within the desired active area of the circuit, is shown. Ideally, sliding is required to go only so far as not to boost the 800 Hz signal above the 0 dB reference level. Thus, in the FIG. 9 response, without modulation control, the sliding produced by the 800 Hz signal at levels of −10, 0, +10 and +20 dB are excessive. FIG. 10 illustrates the response of the circuit with modulation control: sliding at and above 0 dB is greatly reduced. The effect is progressively reduced for low signal levels but is observable to some extent at the −10 dB signal level.

Figure 11:
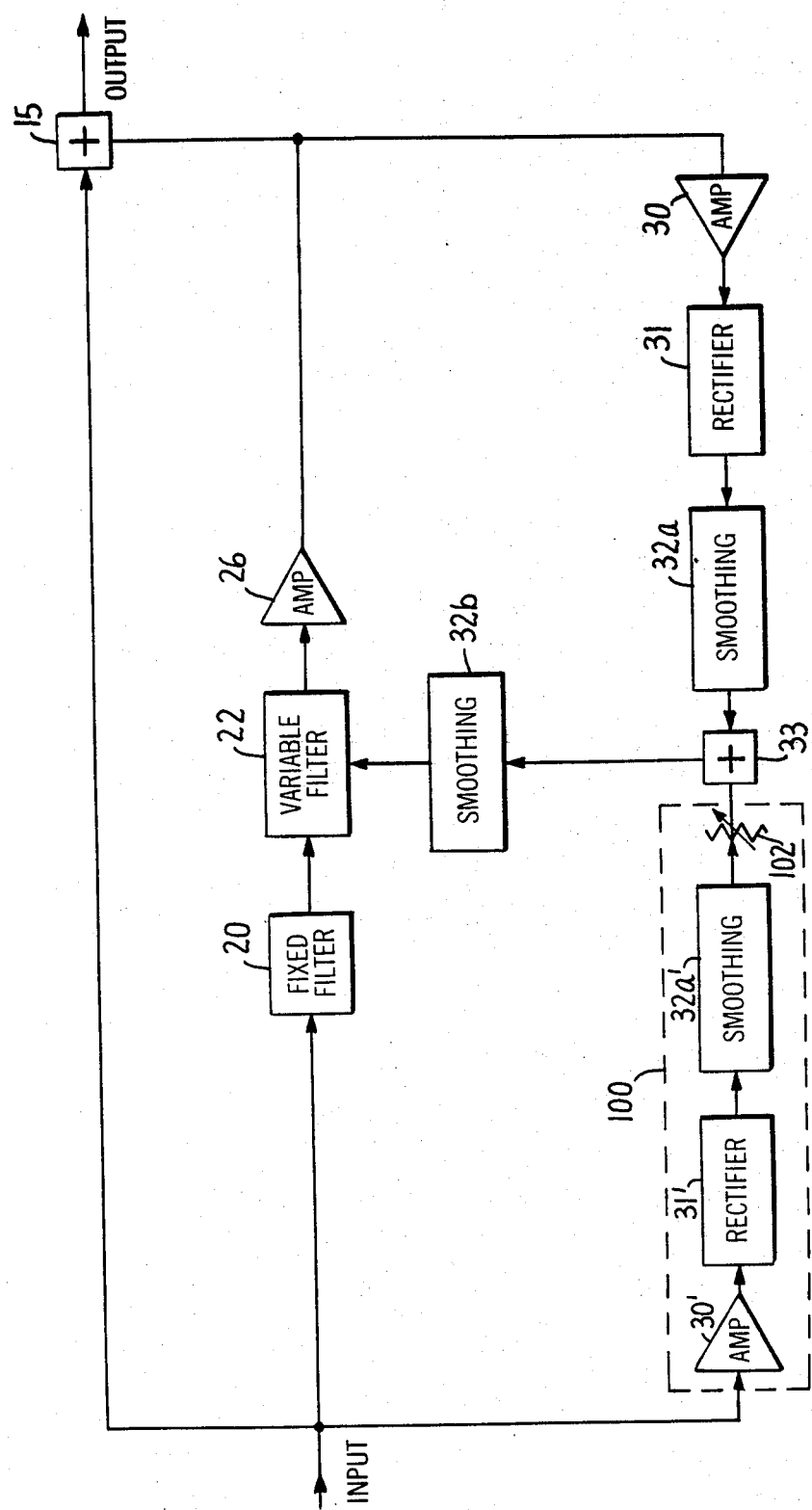
FIG. 11 is a block diagram of a preferred embodiment of the invention embodied in a sliding band compressor.

FIG. 11 shows generally a preferred embodiment of the modulation control of the present invention embodied in a dual path bi-linear sliding band device. Reference numerals are, so far as possible, kept the same as in FIG. 5 for the same and functionally similar elements. The probe tone response curves of FIGS. 7-10 are taken from a sliding band device generally as shown in FIG. 11, with the modulation control sub-circuitry elements within dashed block 100 taken out of the circuit for the response curves without modulation control. For purposes of explanation, the detailed circuitry of FIG. 11 is essentially the same as that of FIGS. 2 and 4. The circuit may be modified as described hereinbefore without affecting the basic operation of the modulation control sub-circuit.

As shown in FIG. 11, the modulation control subcircuit derives a DC control signal from the circuit input (or, optionally from the output of combining circuit 15) by means of an amplifier 30′, rectifier 31′ and smoothing circuitry 32a′. Potentiometer 102 is shown to indicate that the signal from smoothing circuitry 32a′ has a controlled gain. In practice the gain is usually pre-set in the design. A combining circuit 33 subtracts the signal provided by the sub-circuit 100 from the main control signal provided by way of the amplifier 30, rectifier 31 and smoothing circuit 32a′.

The smoothing circuitry of FIG. 11 is broken into two stages in order to minimize the cost of circuit components. Thus, blocks 32a and 32a′ may be identical and each may comprise only a single RC filter section and block 32b which further smooths the combined control signal comprises a further RC filter section.

The signals are rectified to DC (by rectifiers 31 and 31′) before they are combined by the circuit 33 in order to avoid the polarity ambiguity that would result if AC signals were combined and then rectified (i.e., with AC signals there would be two possible stable states).

The arrangement of the embodiment of FIG. 11 thus provides a reference level for stabilization of the DC control signal, a reference level that is dynamically changing with input signal level, thereby shifting or transposing part of the dynamic action of the variable filter to a level region determined by the reference level. The arrangement functions to keep the maximum amplitude of dominant signals in the noise reduction side path at a constant proportion of the input signal at high signal levels. The relative level from the modulation control sub-circuit 100 is selected to minimize sliding action in response to signals outside the sliding band pass band.

Although the embodiment of FIG. 11 functions effectively when the input to the modulation control sub-circuit 100 is taken from the wide band input (or output), other arrangements giving a measure of signal levels at the top end of the dynamic range are possible. For example, some modulation control effects are obtained even if the sub-circuit 100 input is taken from the output of band-pass filter 20. Ideally, equalization is employed in amplifiers 30 and 30′ to optimize the overall modulation control effects (control by pass-band components versus by stop-band components), taking into account the combined frequency response effects of filters 20, 22, and the equalization employed in control amplifier 26.

When the invention is embodied in series connected devices such as set forth in Belgian-PS No. 889,428, a single modulation control sub-circuit may be used to provide a reference signal to each stage. Such a circuit advantageously derives its input from the output of the last compressor stage when the series stages are arranged in the preferred order such that the first stage has the highest level threshold. By deriving the reference signal from the output, the low level stage(s) receive the modulation control effect at lower signal levels, thus enhancing the modulation control action.

As mentioned previously, it is also possible to achieve modulation control of sliding band circuits by other means than by deriving a control signal reference from the input (or output) signal. One or more control signals can be derived from the variable filter output and limited so as to achieve results similar to those achieved by the bucking embodiment of FIG. 11; the essential results is the same, namely to de-sensitize the dynamic modification action of the circuit to high level signals within the stop-band. FIGS. 12, 13 14 and 15 are directed to such embodiments employing limiting.

In the embodiment of FIG. 12, the control signal generating means (blocks 30, 31 and 33 in FIG. 5) is split into three paths by amplifiers 30, 116, and 124 and filters 110, 118, and 126, namely a high frequency path, a mid-frequency path and a low frequency path. Each path includes a limiter (112, 120, 128) that has a pre-set threshold. The limiters can be back to back diodes such as diodes 28 in FIG. 2. For a high frequency audio compressor having a performance generally as shown in FIGS. 7 to 10, the filter frequencies may be as follows, for example: filter 126, 200 Hz low pass; filter 118, 200 to 800 Hz band pass; and filter 110, 80 Hz high pass. The output of each limiter is rectified by rectifiers 114, 122, and 130, combined (or maximum value selected) and applied to smoothing network 32. Alternatively, the limiting functions can be provided after rectification. In operation, the low frequency and mid-frequency band limiters are set to minimize the effect on sliding by signals outside the pass band. Little or no limiting may be required in the high frequency path, and the control effected by this path may be enhanced by providing the amplifier 30 with high frequency boost, as represented by block 52.

Figure 13:
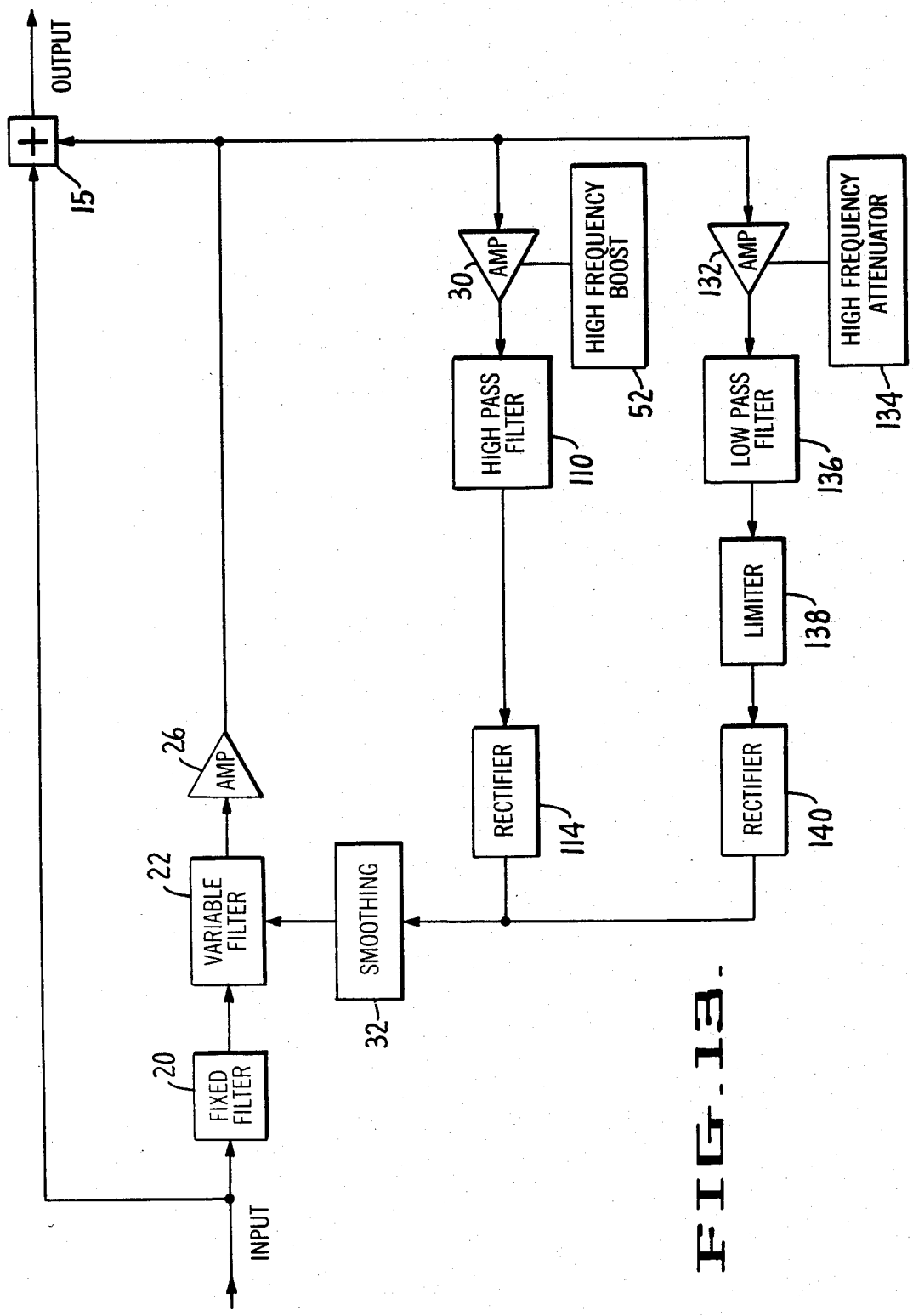

FIG. 13 shows a further split path control circuit embodiment. In this example, two paths are employed, a high frequency path and a low frequency path. The high frequency path is essentially the same as in the embodiment of FIG. 12, except that the limiter 112 is omitted. The low frequency path has an amplifier 132 that has a high frequency attenuation network 134. The amplifier output is applied to a low pass filter 136 and to a limiter 138. The limiter threshold is set along with the various filter and amplifier filter characteristics to achieve the best immunity from sliding band control by stop-band signals. The signals in the two paths are rectified by rectifiers 114 and 140 and combined at the input to the smoothing circuit 32.

Figure 14:
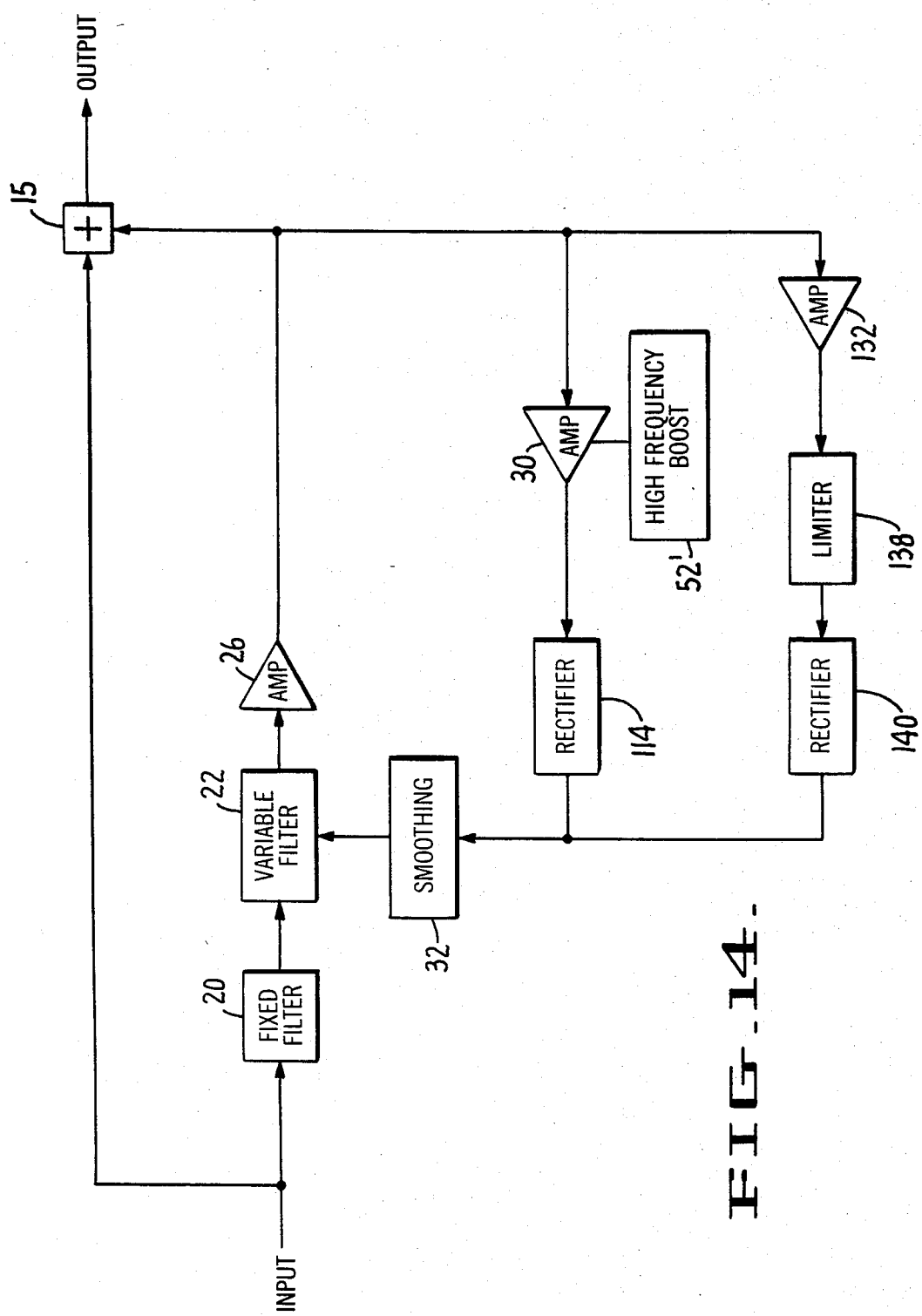

A further simplified embodiment of the FIG. 13 embodiment is shown in FIG. 14. The high pass filter 110, the low pass filter 136 and the amplifier high frequency attenuation network 134 are omitted. The high frequency pre-emphasis network 52' of amplifier 30 is modified from that of network 52 such that the high frequency boost becomes effective at a higher frequency. Consequently only the wide band path containing amplifier 132 carries low frequency signals (along with high frequency signals). The threshold of limiter 138 is adjusted along with the high frequency boost characteristics of network 52' to minimize the effect on sliding by stop-band signals.

Figure 15:
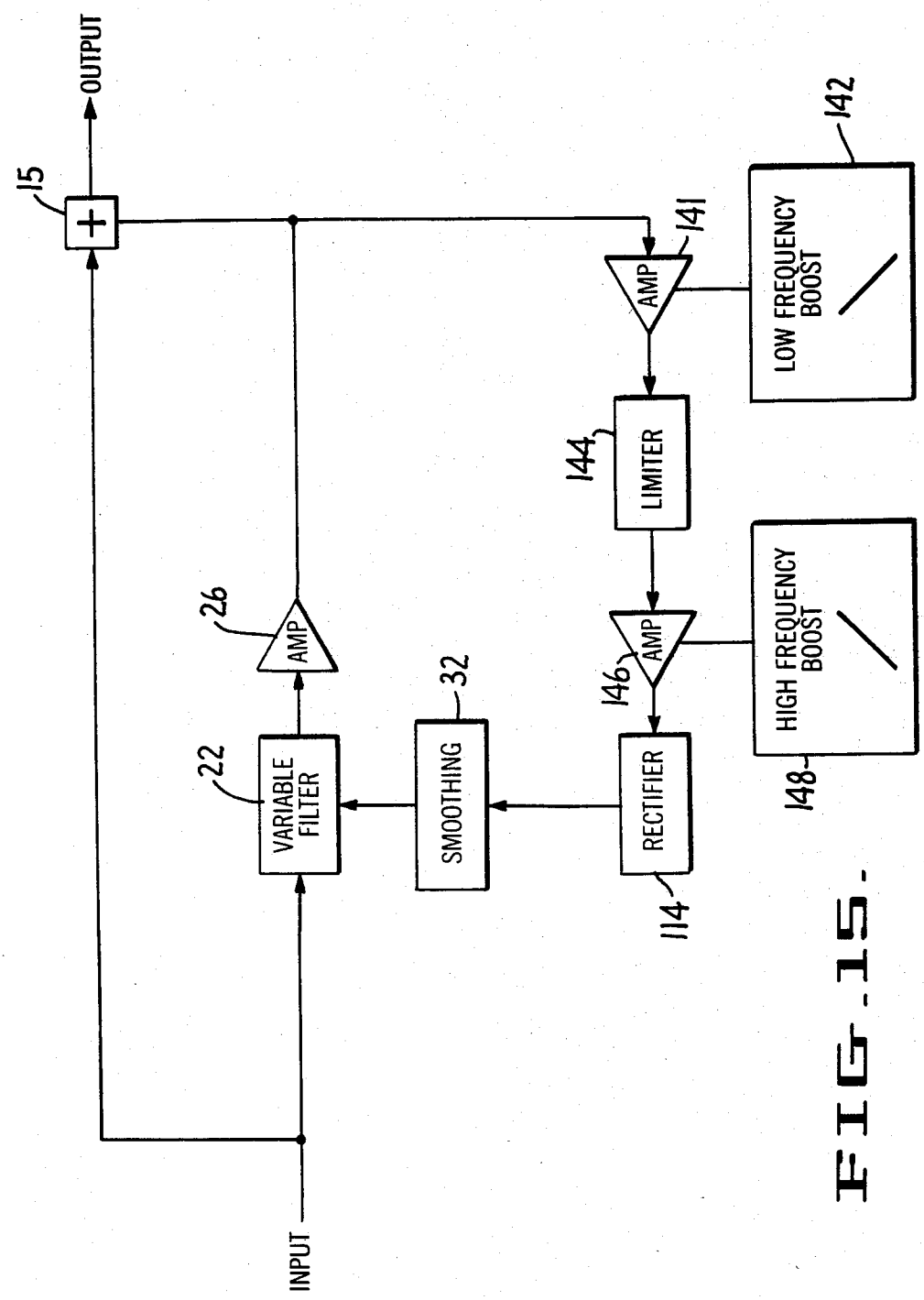

FIG. 15 shows an embodiment having a single path control circuit which includes a frequency dependent amplifier 141 having a low frequency boost network 142, followed by a limiter 144 and an amplifier 146 with a high frequency boost network 148. In operation the low frequency portion of the spectrum which tends to cause undesirable sliding is first boosted and then limited. Limiter 144 is preferably syllabic with its own closed loop amplifier, rectifier, smoothing circuit and controlled gain element (such as blocks 276, 280, 282 and 270 in FIG. 17). Amplifier 146 having a high frequency boost network 148 restores any high frequency pre-emphasis which may be required. The amplifier 146 output is then rectified and smoothed by blocks 114 and 32, respectively. In this single path control circuit the high level stop-band signal components are significantly reduced at the rectification point 114.

For convenience and simplicity the sliding band embodiments have been described in connection with a particular configuration of sliding band compressor. The invention is equally applicable to expanders, with no change in the noise reduction further path control circuits shown in the embodiments of FIGS. 11–15. In noise reduction systems employing compressors and expanders, it is preferred that the modulation control invention be applied to both devices to assure complementarity. The invention is also equally applicable to low frequency sliding band circuits, in which the compression and expansion action is designed to occur in the low frequency region.

FIG. 16 shows a block diagram of a fixed band dual path bi-linear compressor and expander configuration. The fundamental aspects of this system are disclosed in U.S. Pat. Nos. 3,846,719, 3,903,485 and in *Journal of the Audio Engineering Society*, Vol. 15, No. 4, October, 1967, pp. 383–388.

In the known embodiment of FIG. 16, the further path networks 250 provide four bands. Bands 1, 3 and 4 have conventional 12 dB/octave input filters: an 80 Hz low pass filter 252 at the input of band 1, a 3 kHz high pass filter 254 at the input of band 3 and a 9 kHz high pass filter 256 at the input of band 4. Each is followed by an emitter follower isolation stage 258. Band 2 has a frequency response which is complementary to that of bands 1 and 3. Such a response is derived by adding (in adder 260) the outputs of the emitter followers 258 in bands 1 and 3 and subtracting that sum from the overall input signal (in subtractor 262). The output of emitter follower 258 in each band and the output of subtractor 262 are applied to respective limiters 264 and 264'. Limiters 264 and 264' are identical except that limiters 264' in bands 1 and 2 have time constants twice those in bands 3 and 4. The outputs of bands 1–4 are combined with the main path signal in combiner 266. The compressor output is applied to a noisy channel for transmission to the complementary expander in which the output of the identical further path networks are subtracted from the input signal to provide the complementary expansion characteristic.

FIG. 17 shows further details of the limiters 264 and 264'. Each includes an FET attenuator 270 that operates in response to a control signal. The attenuator output is amplified by signal amplifier 272, the gain of which is set to provide the desired low level signal gain. The outputs of all the bands are combined with the main signal in such a way as to produce a low level output from the compressor which is uniformly 10 dB higher than the input signal up to about 5 kHz, above which the increase in level rises smoothly to 15 dB at 15 kHz.

The FET attenuator is controlled by a control signal sub-circuit that provides a compression threshold of 40 dB below peak operating level. The control sub-circuit includes control signal amplifier 276 followed by a phase splitter 278 which drives a full wave rectifier 280. The resulting DC is applied to a smoothing network 282, the output of which is the control signal. Network 282 includes an RC pre-integrator, an emitter follower and a final RC integrator that operate in conjunction with diodes such that both the pre- and final integrators have non-linear characteristics produced by the diodes. Fast, large changes in signal amplitude are passed quickly, whereas small changes are transferred slowly. This dynamic smoothing action produces optimum results with respect to modulation effects, low frequency distortion, and distortion components generated by the control signal. The circuit achieves both fast recovery and low signal distortion.

FIG. 18 shows an actual chart recording plot of response below the compression threshold of a fixed band compressor having a low level gain of 8 dB and a pass-band filter frequency of 800 Hz high-pass. Boost is provided within the active frequency area of the device (determined by the 800 Hz corner frequency) up to levels of about −10 dB (with respect to a 0 dB reference level).

Figure 19:
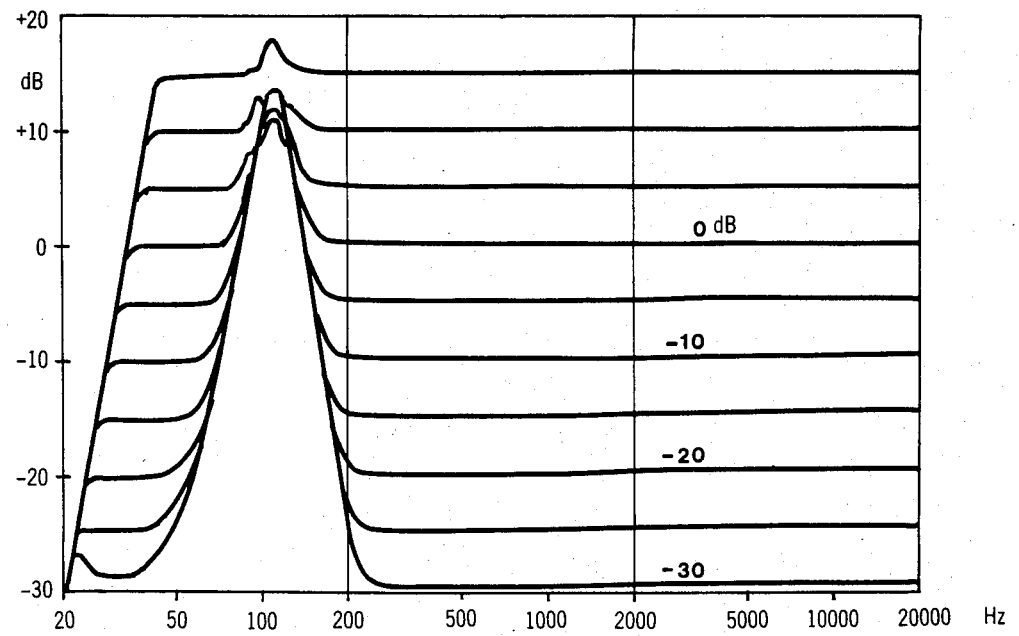

FIG. 19 shows the effect on compression when a high level signal (+10 dB) is present at 100 Hz, which is well below the 800 Hz filter corner frequency. The strong 100 Hz signal in the stop-band effectively blocks the compressor and prevents any compression within the pass-band. Consequently, desired noise reduction in the pass-band is lost. In addition, if the 100 Hz signal is intermittent, compression in the pass-band will come and go with the controlling 100 Hz signal causing noise modulation and/or signal modulation.

Figure 20:
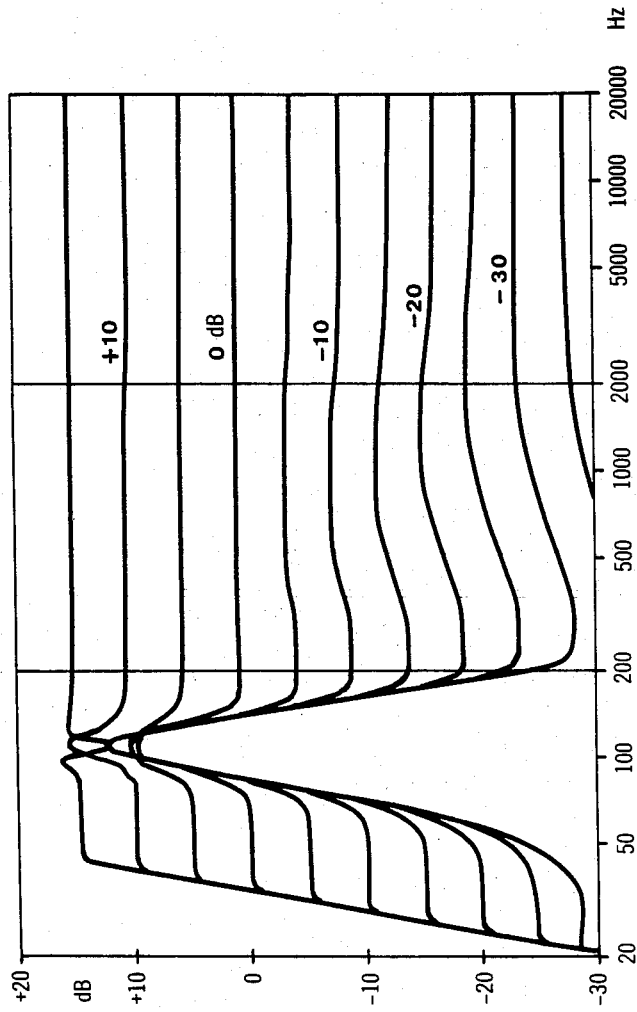

FIG. 20 shows the effect of the addition of a modulation control sub-circuit, described hereinafter, to a fixed band circuit. Compression is restored to the pass-band area even in the presence of the strong (+10 dB) signal at 100 Hz. The modulation control sub-circuit effectively makes the fixed band circuit immune to the strong stop-band signal.

FIG. 21 shows generally the preferred embodiment of the invention as applied to one band of a fixed band dual path bi-linear compressor of the type described in connection with FIG. 16. Two additions are made to the circuit in order to provide modulation control. A modulation control sub-circuit 198, similar to that in the sliding band embodiment of FIG. 11 is provided, which includes a rectifier 208' and a first stage of smoothing 210a'. The modulation control optionally may be fed from the output of the compressor. Elements 208, 208' and 210a, 210a' may be identical (but separate). The level of the modulation control signal from smoothing circuit 210a' is set by attenuator 212 or some other suitable means and is combined by circuit 214 in opposite polarity with the stop-band DC control signal from smoothing circuit 210a. In addition the output of VCA 204 and amplifier 206 is applied to a filter 216 which preferably has the same corner frequency as filter 202, although this is not essential; the comparative graphs FIGS. 19 and 20 were made with a simple 6 dB/octave 3 kHz low-pass filter 216. Nevertheless, filter 216 should ideally have a relatively steep cutoff characteristic, such as 12 db or 18 dB per octave (e.g., a 2 or 3 pole filter) with about the same cutoff frequency as filter 202. The filter 216 output is rectified and smoothed by blocks 218 and 210a, to form the pass-band control signal. The smoothing provided by blocks 210a, 210a' and 210a'' may be a preliminary filtering stage followed by further smoothing in circuit 210b. The output of the pass-band filter channel is applied to maximum selector 222 that receives at its other input the output of combiner 214, the modulation controlled stop-band conrol signal. In its simplest form the maximum selector comprises two diodes which pass the larger of the two input signals; in more sophisticated circuits, operational amplifiers are employed to eliminate the diode voltage drops and to increase accuracy.

In operation, signals in the stop-band are subject to the action of the sub-circuit 198 if there are no dominant signals inside the pass band where compression action is desired. Thus, although a strong signal such as that of +10 db at 100 Hz causes a large control signal to be generated by blocks 208 and 210a (and 210b), that control signal is bucked by the modulation control sub-circuit signal so that the VCA 204 gain is not driven down to cause a loss of compression in the pass-band. If a signal of 100 Hz occurs in the level region of −20 dB, on the other hand, the bucking action is greatly reduced, and the stop-band control signal then appropriately controls the action of the compressor whenever signal conditions are such that the pass-band control signal is not controlling the compressor. If strong signals are present within the active area pass band, the output of the sharp filter channel, the pass-band control circuit will control the maximum selector and allow the VCA to react accordingly.

The level of the modulation control sub-circuit relative to the input or output is set to provide a dynamic reference signal (relative to the input) of sufficient level to result in substantial immunity of the compressor action to strong out of pass band signals.

Comments made regarding equalized control and modulation contrl amplifiers in reference to sliding band circuits are also applicable to fixed band embodiments. Thus, optionally, filter/equalizers 224 and 226 may be inserted in the respective paths to rectifiers 208' and 208. However, the opportunities for advantageously working one frequency dependent characteristic against another in the fixed band case are less than with sliding bands; indeed, this is why an extra control circuit is required in the fixed band case (3 circuits versus 2).

It is also possible to achieve modulation control of fixed band circuits by other means than deriving a control signal reference from the compressor or expander input (or output) signal. One or more control signals can be derived from the controllable element (attenuator or VCA) output and limited so as to achieve results similar to those achieved by the bucking embodiment of FIG. 21. FIG. 22 is directed to such limiting embodiments.

In the embodiment of FIG. 22, the control signal generating means (blocks 276, 278, 280 and 282 in FIG. 17) is split into two paths, one having an amplifier 228, a sharp cutoff filter (as in the FIG. 21 embodiment) and a rectifier 218 and the other having an amplifier 230, a limiter 232 and a rectifier 218'. The threshold of limiter 232 (which can be back to back diodes, for example) is selected such that limiting action begins at relatively high levels, at about the same levels at which the output from combiner 214 begins to become predominant in the embodiment of FIG. 21. The outputs of rectifiers 218 and 218' can be combined and applied to smoothing circuit 210, the output of which is applied as the control signal to VCA 204 or the rectifier outputs can be applied to (or serve as) a maximum selector circuit (such as block 222 in FIG. 21) and its output applied to smoothing network 210.

In operation, the embodiment of FIG. 22 functions in a similar manner to the FIG. 21 embodiment.

What is claimed is:

1. A circuit arrangement for modifying the dynamic range of an input signal, comprising:
   frequency selective circuit means for dividing the frequency spectrum in which the input signal lies into pass-band and stop-band regions, and
   dynamic modification means for modifying the dynamic range of signal components in the pass-band region in response to signal components lying in the pass-band and stop-band regions, the dynamic modification means being less responsive to stop-band signal components as the level of the input signal rises.

2. A circuit arrangement according to claim 1 wherein the dynamic modification means includes a control circuit and a variable gain device, the variable dynamic action of which is controlled by the control circuit, the control circuit including means responsive to stop-band signal components for counteracting the dynamic range modification as the level of the input signal rises.

3. A circuit arrangement according to claim 2 wherein said means for counteracting includes means for non-linearly processing said stop-band signal components.

4. The circuit arrangement of claim 2 wherein said means for counteracting includes a sub-circuit for generating a bucking reference signal, the reference signal providing information as the input signal level rises for reducing the effect of stop-band signal components.

5. The circuit arrangement of claim 2 wherein the control circuit includes limiting and frequency-selective circuit means for acting preferentially on signals in the stop-band to reduce the effect of stop-band signal components as the input signal level rises.

6. A circuit arrangement according to any of claims 1 through 18 wherein the circuit arrangement has a bi-linear characteristic composed of a low level portion of substantially constant gain up to a threshold, an intermediate level portion, above the threshold, of changing gain providing a maximum compression ratio, and a high level portion of substantially constant gain different from the gain of the low level portion.

7. A circuit arrangement according to claim 1 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, boosts the main path signal component, but which is so limited that, in the upper part of the input dynamic range, the further path signal component is smaller than the main path signal component.

8. A circuit arrangement according to claim 6 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, boosts the main path signal component, but which is so limited that, in the upper part of the input dynamic range, the further path signal component is smaller than the main path signal component.

9. A circuit arrangement according to claim 8 wherein the further path also has a bi-linear characteristic such that as the main signal component level rises the further path signal level is substantially proportional to the main path signal level.

10. A circuit arrangement according to claim 1 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, bucks the main path signal component, but which is so limited that, in the upper part of the input dynamic range, the further path signal component is smaller than the main path signal components.

11. A circuit arrangement according to claim 6 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, bucks the main path signal component, but which is so limited that, in the upper part of the input dynamic range, the further path signal component is smaller than the main path signal component.

12. A circuit arrangement according to claim 11 wherein the further path also has a bi-linear characteristic such that as the main signal component level rises the further path signal level is substantially proportional to the main path signal level.

13. A circuit arrangement according to any of claims 1 through 5 wherein the circuit arrangement has a bi-linear characteristic composed of a low level portion of substantially constant gain up to a threshold, an intermediate level portion, above the threshold, of changing gain providing a maximum expansion ratio, and a high level portion of substantially constant gain different from the gain of the low level portion.

14. A circuit arrangement according to claim 13 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, boosts the main path signal component, but which is so limited that, in the upper part of the input dynamic range, the further path signal component is smaller than the main path signal component.

15. A circuit arrangement according to claim 14 wherein the further path also has a bi-linear characteristic such that as the main signal component level rises the further path signal level is substantially proportional to the main path signal level.

16. A circuit arrangement according to claim 13 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, bucks the main path signal component, but which is so limited that, in the upper part of the input dynamic range, the further path signal component is smaller than the main path signal component.

17. A circuit arrangement according to claim 16 wherein the further path also has a bi-linear characteristic such that as the main signal component level rises the further path signal level is substantially proportional to the main path signal level.

18. A circuit arrangement according to claim 1, for audio signals, wherein the dynamic modification means includes a control circuit and a variable gain device, the variable dynamic action of which is controlled by the control circuit, including means providing a control signal for the variable gain device to effect the variable dynamic action, said control circuit comprising a first sub-circuit including at least one filter having frequency characteristics which more strongly favor pass-band signals than said frequency selective circuit means and rectifying means for providing a first signal, and a second sub-circuit deriving a second signal from the variable gain device output and including further rectifying means, and deriving a third signal from at least one of the input and the output of the circuit arrangement and including yet further rectifying means, the third signal constituting a reference signal for bucking the second signal to provide a fourth signal, the reference signal dynamically varying in level with the level of the respective on of the input and output signals, the second sub-circuit including means for setting the gain of the reference signal to reduce the effects of stop-band signal components in the third signal as the input signal level rises, and means for selecting the larger of the first and fourth signals to provide a control signal for said variable gain device.

19. A circuit arrangement according to claim 1, for audio signals, wherein the dynamic modification means includes a control circuit and a variable gain device, the variable dynamic action of which is controlled by the control circuit, including means providing a control signal for the variable gain device to effect the variable dynamic action, said control circuit comprising a first sub-circuit including at least one filter having frequency characteristics which more strongly favor pass-band signals than said frequency selective circuit means and rectifying means, and a second sub-circuit including limiting and frequency-selective circuit means for acting preferentially on signals in the stop-band to reduce the effect of stop-band signal components as the input signal level increases.

20. A circuit arrangement for modifying the dynamic range of an input signal, comprising:
frequency selective circuit means for dividing the frequency spectrum in which the input signal lies into pass-band and stop-band regions, the pass-band frequency region sliding in response to signal components lying in the pass-band and stop-band regions, the frequency selective circuit means becoming less responsive to stop-band signal components as the level of the input signal rises, and
means for modifying the dynamic range of signal components in the pass-band region.

21. A circuit arrangement according to claim 20 wherein the frequency selective circuit means includes a control circuit and a variable filter, the variable action of which is controlled by the control circuit, the control circuit including means responsive to stop-band signal components for counteracting the sliding of the pass-band frequency region as the input signal level rises.

22. A circuit arrangement according to claim 21 wherein said means for counteracting includes means for non-linearly processing said stop-band signal components.

23. The circuit arrangement of claim 21 wherein said means for counteracting includes a sub-circuit for generating a bucking reference signal, the reference signal providing information for reducing the effect of stop-band signal components as the input signal level rises.

24. The circuit arrangement of claim 21 wherein the control circuit includes limiting and frequency-selective circuit means for acting preferentially on signals in the stop-band to reduce the effect of stop-band signal components as the input signal level rises.

25. A circuit arrangement according to any of claims 20 through 24 wherein the circuit arrangement has a bi-linear characteristic composed of a low level portion of substantially constant gain up to a threshold, an intermediate level portion, above the threshold, of changing gain providing a maximum compression ratio ratio, and a high level portion of substantially constant gain different from the gain of the low level portion.

26. A circuit arrangement according to claim 20 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, boosts the main path signal component, but which is so limited that, in the upper part of the input dynamic range, the further path signal component is smaller than the main path signal component.

27. The circuit arrangement according to claim 25 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, boosts the main path signal component, but which is so limited that, in the upper part of the input dynamic range, the further path signal component is smaller than the main path signal component.

28. A circuit arrangement according to claim 27 wherein the further path also has a bi-linear characteristic such that as the input signal level rises the further path signal level becomes a predetermined proportion of the main path signal level.

29. A circuit arrangement according to claim 20 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, bucks the main path signal component, but which is so limited that, in the upper part of the input dynamic range, the further path signal component is smaller than the main path signal component.

30. A circuit arrangement according to claim 25 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, bucks the main path signal component, but which is so limited that, in the upper part of the input dynamic range, the further path signal component is smaller than the main path signal component.

31. A circuit arrangement according to claim 30 wherein the further path also has a bi-linear characteristic such that as the input signal level rises the further path signal level becomes a predetermined proportion of the main path signal level.

32. A circuit arrangement according to any of claims 20 through 24 wherein the circuit arrangement has a bi-linear characteristic composed of a low level portion of substantially constant gain up to a threshold, an intermediate level portion, above the threshold, of changing gain providing a maximum expansion ratio ratio, and a high level portion of substantially constant gain different from the gain of the low level portion.

33. A circuit arrangement according to claim 32 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, boosts the main path signal component, but which is so limited that, in the upper part of the input dynamic range, the further path signal component is smaller than the main path signal component.

34. A circuit arrangement according to claim 33 wherein the further path also has a bi-linear characteristic such that as the input signal level rises the further path signal level becomes a predetermined proportion of the main path signal level.

35. A circuit arrangement according to claim 32 wherein the circuit arrangement is a dual-path circuit comprising a main signal component in a main path which is linear with respect to dynamic range and a further path which has its input signal derived from at least one point in the main path and its output signal combined with the signal in the main path, the further path providing a signal which, at least in an upper part of the frequency band, bucks the main path signal component, but which is so limited that, in the upper part of the input dynamic range, the further path signal component is smaller than the main path signal component.

36. A circuit arrangement according to claim 35 wherein the further path also has a bi-linear characteristic such that as the input signal level rises the further path signal level becomes a predetermined proportion of the main path signal level.

37. A circuit arrangement according to claim 20, for audio signals, wherein the frequency selective circuit means includes a control circuit and a variable filter, which filter provides a boost in a high frequency region of the signal band, and responsive to dominant signals to cause the filter corner frequency to slide in the sense narrowing the boosted region, and wherein the control circuit includes rectifying means providing a control signal, derived from at least one of the filter input and output, to a controlled impedance device of the filter to effect the sliding of the filter corner frequency, said control circuit including a sub-circuit providing a reference signal for bucking the control signal and derived from at least one of the input and output of the circuit arrangement, the reference signal dynamically varying in level with the level of said at least one of the input and output signals, the sub-circuit including means for setting the gain of the reference signal such that the effects of stop-band signal components are reduced as the input signal level rises.

38. A circuit arrangement according to claim 20, for audio signals, wherein the frequency selective circuit means includes a control circuit and a variable filter, which filter provides a boost in a low frequency region of the signal band, and responsive to dominant signals to cause the filter corner frequency to slide in the sense narrowing the boosted region, and wherein the control circuit includes rectifying means providing a control signal, derived from at least one of the filter input and output, to a controlled impedance device of the filter to effect the sliding of the filter corner frequency, said control circuit including a sub-circuit providing a reference signal for bucking the control signal and derived from at least one of the input and output of the circuit arrangement, the reference signal dynamically varying in level with the level of said at least one of the input and output signals, the sub-circuit including means for setting the gain of the reference signal such that the effects of stop-band signal components are reduced as the input signal level rises.

39. A circuit arrangement according to claim 20, for audio signals, wherein the frequency selective circuit means includes a control circuit and a variable filter, which filter provides a cut in a high frequency region of the signal band, and responsive to dominant signals to cause the filter corner frequency to slide in the sense narrowing the cut region, and wherein the control circuit includes rectifying means providing a control signal, derived from at least one of the filter input and output, to a controlled impedance device of the filter to effect the sliding of the filter corner frequency, said control circuit including a sub-circuit providing a reference signal for bucking the control signal and derived from at least one of the input and output of the circuit arrangement, the reference signal dynamically varying in level with the level of said at least one of the input and output signals, the sub-circuit including means for setting the gain of the reference signal such that the effects of stop-band signal components are reduced as the input signal level rises.

40. A circuit arrangement according to claim 20, for audio signals, wherein the frequency selective circuit means includes a control circuit and a variable filter, which filter provides a cut in a low frequency region of the signal band, and responsive to dominant signals to cause the filter corner frequency to slide in the sense narrowing the cut region, and wherein the control circuit includes rectifying means providing a control signal, derived from at least one of the filter input and output, to a controlled impedance device of the filter to effect the sliding of the filter corner frequency, said control circuit including a sub-circuit providing a reference signal for bucking the control signal and derived from at least one of the input and output of the circuit arrangement, the reference signal dynamically varying in level with the level of said at least one of the input and output signals, the sub-circuit including means for setting the gain of the reference signal such that the effects of stop-band signal components are reduced as the input signal level rises.

41. A circuit arrangement according to claim 20, for audio signals, wherein the frequency selective circuit means includes a control circuit and a variable filter, which filter provides a boost in a preselected frequency region of the signal band, and responsive to dominant signals to cause the filter corner frequency to slide in the sense narrowing the preselected region, and wherein the control circuit includes rectifying means providing a control signal, derived from at least one of the filter input and output, to a controlled impedance device of the filter to effect the sliding of the filter corner frequency, said control circuit including limiting and frequency-selective circuit means for acting preferentially on signals in the stop-band to reduce the effects of stop-band signal components as the input signal level rises.

42. A circuit arrangement according to claim 20, for audio signals, wherein the frequency selective circuit means includes a control circuit and a variable filter, which filter provides a cut in a preselected frequency region of the signal band, and responsive to dominant signals to cause the filter corner frequency to slide in the sense narrowing the cut region, and wherein the control circuit includes rectifying means providing a control signal, derived from at least one of the filter input and output, to a controlled impedance device of the filter to effect the sliding of the filter corner frequency, said control circuit including limiting and frequency-selective circuit means for acting preferentially on signals in the stop-band to reduce the effects of stop-band signal components as the input signal level rises.

* * * * *

UNITED STATES PATENT AND TRADEMARK OFFICE
CERTIFICATE OF CORRECTION

PATENT NO. : 4,498,055

DATED : Feb. 5, 1985

INVENTOR(S) : Dolby

It is certified that error appears in the above-identified patent and that said Letters Patent is hereby corrected as shown below:

Col. 19, line 45: "18" should be --5--.

Col. 20, line 24: "components" should be --component--.

Col. 21, lines 34-35: "respective on of" should be --respective one of--.

Col. 22, line 27: delete the extra "ratio".

Col. 23, line 25: delete the extra "ratio".

Signed and Sealed this

Fifteenth Day of October 1985

[SEAL]

Attest:

DONALD J. QUIGG

Attesting Officer

Commissioner of Patents and Trademarks—Designate